(12) United States Patent
Yu et al.

(10) Patent No.: US 12,199,051 B2
(45) Date of Patent: Jan. 14, 2025

(54) INTEGRATED CIRCUIT STRUCTURE AND METHOD

(71) Applicant: Taiwan Semiconductor Manufacturing Co., Ltd., Hsinchu (TW)

(72) Inventors: Chen-Hua Yu, Hsinchu (TW); Kuo Lung Pan, Hsinchu (TW); Tin-Hao Kuo, Hsinchu (TW); Hao-Yi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/359,273

(22) Filed: Jul. 26, 2023

(65) Prior Publication Data

US 2023/0369254 A1    Nov. 16, 2023

Related U.S. Application Data

(62) Division of application No. 17/241,715, filed on Apr. 27, 2021, now Pat. No. 11,764,171.

(51) Int. Cl.
*H01L 23/64*      (2006.01)
*H01L 21/48*      (2006.01)
(Continued)

(52) U.S. Cl.
CPC ........ *H01L 23/645* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68372* (2013.01);
(Continued)

(58) Field of Classification Search
CPC ............ H01L 21/4853; H01L 21/4857; H01L 21/565; H01L 21/568; H01L 21/6835; H01L 23/03; H01L 23/128; H01L 23/645; H01L 23/5383; H01L 23/5386; H01L 23/5389; H01L 24/19; H01L 24/20; H01L 2221/68372; H01L 2924/1437; H01L 2924/1903; H01L 2924/19042; H01L 2924/19103; H01L 2224/18
See application file for complete search history.

(56) References Cited

U.S. PATENT DOCUMENTS 8,993,380 B2   3/2015   Hou et al.
9,281,254 B2   3/2016   Yu et al.
(Continued)

*Primary Examiner* — Kyoung Lee
*Assistant Examiner* — Christina A Sylvia
(74) *Attorney, Agent, or Firm* — Slater Matsil, LLP

(57) ABSTRACT

A semiconductor device includes a first plurality of dies encapsulated by an encapsulant, an interposer over the first plurality of dies, an interconnect structure over and electrically connected to the interposer, and a plurality of conductive pads on a surface of the interconnect structure opposite the interposer. The interposer includes a plurality of embedded passive components. Each die of the first plurality of dies is electrically connected to the interposer. The interconnect structure includes a solenoid inductor in a metallization layer of the interconnect structure.

20 Claims, 39 Drawing Sheets

(51) Int. Cl.
  *H01L 21/56*    (2006.01)
  *H01L 21/683*   (2006.01)
  *H01L 23/00*    (2006.01)
  *H01L 23/31*    (2006.01)
  *H01L 23/538*   (2006.01)

(52) U.S. Cl.
  CPC ............ *H01L 2224/214* (2013.01); *H01L 2924/1437* (2013.01); *H01L 2924/1903* (2013.01); *H01L 2924/19042* (2013.01); *H01L 2924/19103* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,867,879 B2 | 12/2020 | Yu et al. |
| 10,978,392 B2 | 4/2021 | Lai et al. |
| 2008/0099812 A1 | 5/2008 | Nagata et al. |
| 2011/0127975 A1 | 6/2011 | Hosokawa et al. |
| 2015/0302974 A1 | 10/2015 | Zhao et al. |
| 2015/0371932 A1* | 12/2015 | Hu ............ H01L 21/4825 438/123 |
| 2016/0238793 A1 | 8/2016 | Frankel et al. |
| 2017/0053897 A1* | 2/2017 | Lai ............ H01L 23/5389 |
| 2017/0064837 A1* | 3/2017 | Li ............ H01L 21/4857 |
| 2017/0278779 A1 | 9/2017 | Hu |
| 2019/0385925 A1 | 12/2019 | Walczyk et al. |
| 2020/0075553 A1 | 3/2020 | Delacruz et al. |
| 2020/0135709 A1 | 4/2020 | Lee et al. |
| 2020/0303314 A1 | 9/2020 | Kang et al. |
| 2020/0402934 A1* | 12/2020 | Kim ............ H01L 23/645 |
| 2020/0411488 A1* | 12/2020 | Yu ............ H01L 23/5383 |
| 2021/0091056 A1 | 3/2021 | Yu et al. |

\* cited by examiner

INTEGRATED CIRCUIT STRUCTURE AND METHOD

PRIORITY CLAIM AND CROSS-REFERENCE

This application is a divisional of U.S. patent application Ser. No. 17/241,715, filed on Apr. 27, 2021, which application is hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
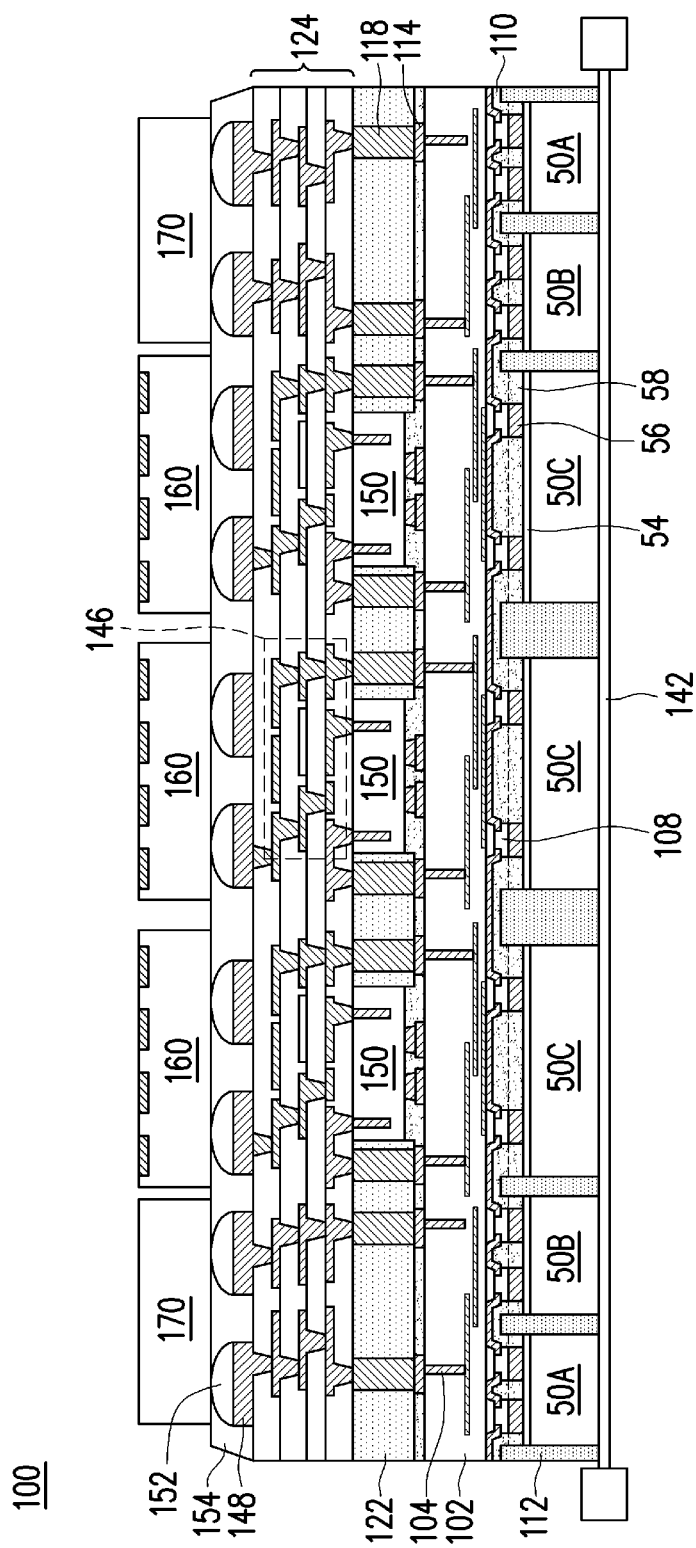
FIG. 1 illustrates a cross-sectional view of a system-on-wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a super large micro-system is a system-on-wafer (SoW) assembly comprising technology from chip-on-wafers (CoWs), front-to-front and/or front to back system-on-integrated chips (SoICs), and silicon chip-on-wafer-on-substrates (CoWoS). The SoW assembly may have a small form factor and exhibit superior electrical performance due to its compact structure. Wafer scale interposer(s) may comprise integrated passive devices (IPDs), e.g. capacitors, or static random access memory (SRAM) circuitry. The SoW may allow for heterogeneous integration with short interconnects from system-on-chip (SoC) dies to SRAM circuitry, symmetrical molding structure, which may reduce small component warpage, and miniaturization of voltage regulator modules (VRMs) as embedded solenoid inductors in redistribution structures. Integrated fan-out (InFO) packages directly combining Pulse Width Modulation (PWM) circuits for power management and Metal Oxide Semiconductor Field Effect Transistors (MOSFETs) may be attached to the VRMs through the redistribution structure. Wafer scale patterning of the wafer scale interposer and the redistribution structure may allow the super-large micro system to have high performance computing power compared with a conventional printed circuit board (PCB) system. Wafer scale patterning may be performed with image shift exposure or multi-mask exposure in a single layer. The interposer and InFO packages may have fine redistribution layer pitches, which may provide high bandwidth between die-to-die interconnects.

FIG. 1 illustrates a system-on-wafer 100, in accordance with some embodiments. Integrated circuit (IC) dies 50 (labeled 50A, 50B, and 50C) are encapsulated by an encapsulant 112. In some embodiments, the IC dies 50A are input/output (I/O) dies, the IC dies 50B are memory dies, and the IC dies 50C are system-on-chip (SoC) dies. In some embodiments, the IC dies 50B may be replaced with stacked high bandwidth memory (HBM) devices that each include multiple memory dies. A wafer scale interposer 102 is bonded over the IC dies 50A, 50B, and 50C and the encapsulant 112. Conductive pads 108 and an insulating, bonding layer 110 are on a side of the interposer 102 facing the IC dies 50, which allow the IC dies 50 to be bonded to the interposer 102 by hybrid bonding, for example. The interposer 102 may comprise a bulk silicon wafer with active and passive components, such as static random access memory (SRAM) circuitry comprising transistors connected by metallization layers, capacitors, inductors, diodes, resistors and the like (not shown) formed in the interposer 102. The interposer further includes conductive pads 114 on a surface opposing the IC dies 50, and the conductive pads 114 are physically and electrically coupled to through substrate vias (TSVs) 104 in the interposer 102 for connection of the circuitry of the interposer 102 (e.g., SRAM circuitry) to dies 150 and through dielectric vias (TDVs) 118. The dies 150 and the TDVs 118 are on the interposer 102 and are encapsulated by an encapsulant 122. The dies 150 may be integrated passive device (IPD) dies comprising passive devices such as, e.g., resistors, inductors, capacitors, or the like. A redistribution structure 124, also referred to as an interconnect structure 124, is on the dies 150 and the TDVs 118 and physically and electrically couples the dies 150 and the TDVs 118 with components 160 and external connectors 170 on a top side of the redistribution structure 124. The redistribution structure 124 comprises solenoid inductors 146, which may function as miniaturized voltage regulator modules (VRMs) to provide increased electrical performance. The components 160 may be dies, chips, or packages such as integrated fan-out (InFO) packages. In some embodiments, the components 160 comprise Pulse Width Modulation (PWM) circuits that comprise Metal Oxide Semiconductor Field Effect Transistors (MOSFETs) for power management, logic circuits, combinations thereof, or the like. The external connectors 170 may be electrical and physical interfaces for the system-on-wafer 100 to external systems such as optical connectors (see below, FIG. 37B).

Figure 2:
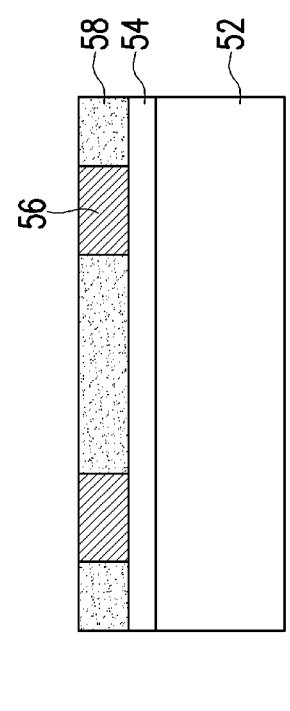
FIG. 2 illustrates a cross-sectional view of an integrated circuit die, in accordance with some embodiments.

FIG. 2 illustrates a cross-sectional view of an integrated circuit die 50, in accordance with some embodiments. The integrated circuit die 50 will be packaged in subsequent processing to form a system-on-wafer, such as the system-on-wafers 100 and 400 shown in FIGS. 1 and 21. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.) or passive devices (e.g., capacitors, resistors, inductors, etc.).

An interconnect structure 54 is over the semiconductor substrate 52, and interconnects the devices to form an integrated circuit. The interconnect structure 54 may be formed by, for example, metallization patterns in dielectric layers on the semiconductor substrate 52. The metallization patterns include metal lines and vias formed in one or more low-k dielectric layers. The metallization patterns of the interconnect structure 54 are electrically coupled to the devices of the semiconductor substrate 52. The integrated circuit die 50 further includes pads, such as aluminum pads, to which external connections are made. The pads are on the active side of the integrated circuit die 50, such as in and/or on the interconnect structure 54. One or more passivation films may be on the integrated circuit die 50, such as on portions of the interconnect structure 54. Die connectors 56, such as conductive pillars (for example, formed of a metal such as copper), are physically and electrically coupled to the interconnect structure 54. The die connectors 56 may be formed by, for example, plating, or the like. The die connectors 56 electrically couple the respective integrated circuits of the integrated circuit die 50.

Optionally, solder regions (e.g., solder balls or solder bumps) may be disposed on the pads of the interconnect structure 54. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and packaging, and dies, which fail the CP testing, are not packaged. After testing, the solder regions may be removed in subsequent processing steps.

A dielectric layer 58 may (or may not) be on the active side of the integrated circuit die 50, such as on the passivation films and the die connectors 56. The dielectric layer 58 laterally encapsulates the die connectors 56, and the dielectric layer 58 is laterally coterminous with the integrated circuit die 50. Initially, the dielectric layer 58 may bury the die connectors 56, such that the topmost surface of the dielectric layer 58 is above the topmost surfaces of the die connectors 56. In some embodiments where solder regions are disposed on the die connectors 56, the dielectric layer 58 may also bury the solder regions. Alternatively, the solder regions may be removed prior to forming the dielectric layer 58.

The dielectric layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 58 may be formed, for example, by spin coating, lamination, chemical vapor deposition (CVD), or the like. In some embodiments, the die connectors 56 are exposed through the dielectric layer 58 during formation of the integrated circuit die 50. In some embodiments, the die connectors 56 remain buried and are exposed during a subsequent process for packaging the integrated circuit die 50. Exposing the die connectors 56 may remove any solder regions that may be present on the die connectors 56.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 54.

FIGS. 3-20 illustrate cross-sectional views of intermediate steps during a process for forming a system-on-wafer 100 as shown above in FIG. 1, in accordance with some embodiments. As such, the system-on-wafer 100 is large. For example, the system-on-wafer 100 can have a surface area in excess of 10,000 mm$^2$.

Figure 3:
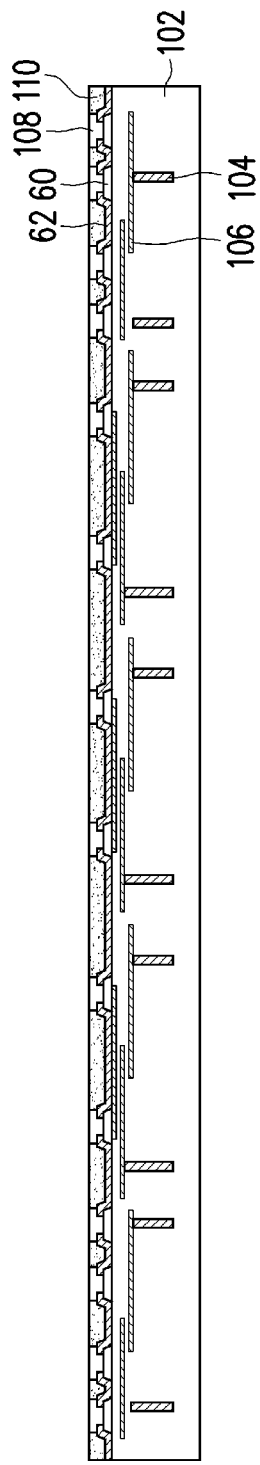
FIGS. 3-19 illustrate cross-sectional views of intermediate steps during a process for forming a system-on-wafer, in accordance with some embodiments.

In FIG. 3, conductive pads 108 and a bonding layer 110 are formed on a wafer scale interposer 102. The interposer 102 may comprise a bulk silicon wafer. In some embodiments, the interposer 102 may comprise any semiconductor substrate, ceramic substrate, quartz substrate, or the like. In some embodiments, interposer 102 comprises a silicon-on-insulator (SOI) or other composite wafer. In some embodiments, active and passive components, such as transistors, diodes, resistors and the like (not shown) may be formed in the interposer 102. In some embodiments, transistors and conductive lines and vias forming SRAM circuitry are embedded within the interposer 102. For example, active devices may be formed on the semiconductor substrate, and conductive features 106 may be formed over the active devices. The conductive features 106 electrically connect the active devices to form one or more SRAM arrays.

Embedded within the interposer 102 are various metal interconnect features, such as through substrate vias (TSVs) 104 and conductive features 106. A passivation layer 62 is disposed on a top surface of the interposer 102, and input/output (I/O) pads 6o are exposed at a top surface of the passivation layer 62. The I/O pads 6o are physically and electrically coupled to the conductive features 106 and may comprise a conductive material such as, e.g., copper, titanium, tungsten, aluminum, or the like. The passivation layer 62 may be a polymer such as PBO, polyimide, BCB, or the like; a nitride such as silicon nitride or the like; an oxide such as silicon oxide, PSG, BSG, BPSG, or the like; the like, or a combination thereof. The passivation layer 62 may be formed, for example, by spin coating, lamination, chemical vapor deposition (CVD), or the like.

Still referring to FIG. 3, conductive pads 108 are formed on the I/O pads 60 for connection of the TSVs 104, conductive features 106, and SRAM circuitry embedded within the interposer 102 to subsequently attached IC dies (see below, FIG. 4). The conductive pads 108 are formed on top surfaces of the I/O pads 60. The conductive pads 108 may exhibit fine pitches in a range of about 10 μm to about 100 μm, which may provide high bandwidth between subsequently attached IC dies 50s (see below, FIG. 5) and embedded SRAM circuitry components 60 in the interposer 102.

In some embodiments, the conductive pads 108 are formed with a seed layer and plating process. A seed layer is formed over the interposer 102. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. Wafer scale patterning of the photoresist may be performed with image shift exposure or multi-mask exposure in a single layer. The photoresist may be formed by spin coating or the like and may be exposed to light for patterning. The pattern of the photoresist corresponds to the conductive pads 108. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive pads 108. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, the conductive pads 108 are formed with a damascene process in which the bonding layer no, which is a dielectric layer, is patterned and etched utilizing photolithography techniques to form trenches corresponding to the desired pattern of conductive pads. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive pads 108 may be formed by depositing a seed layer of copper or a copper alloy, and filling the trenches by electroplating. A chemical mechanical planarization (CMP) process or the like may be used to remove excess conductive material from a surface of the bonding layer no and to planarize the surface for subsequent processing.

FIG. 3 further shows a bonding layer no formed over the interposer 102 between the conductive pads 108. The bonding layer no may be a dielectric material such as an oxide, e.g. silicon oxide, or the like. The bonding layer no may be formed, for example, by spin coating, lamination, chemical vapor deposition (CVD), or the like. However, any suitable method or materials may be used. After forming the bonding layer 110, a planarization process is performed on the bonding layer no to expose the conductive pads 108. Top surfaces of bonding layer no and the conductive pads 108 may be substantially coplanar after the planarization process within process variations. The planarization process may be, for example, a chemical-mechanical polish (CMP), a grinding process, or the like.

Figure 4:
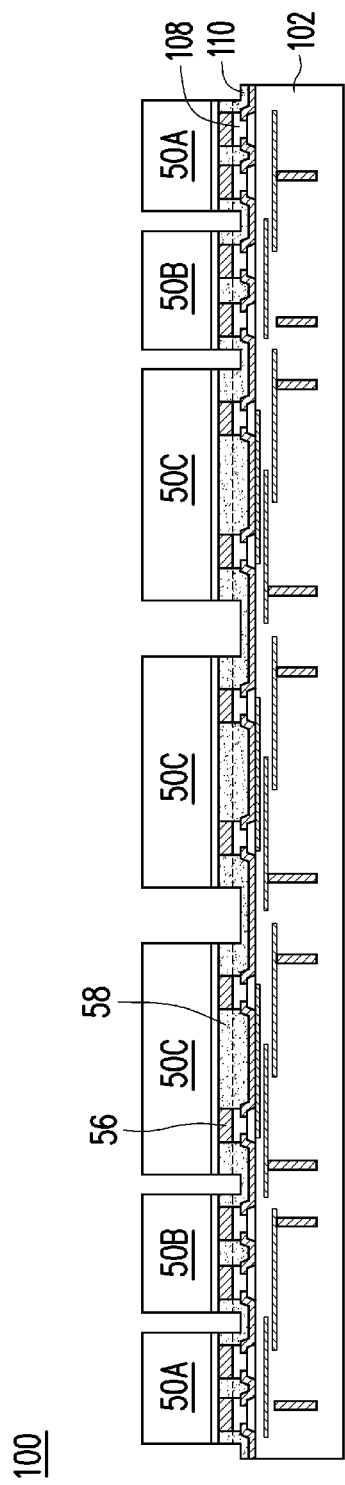

In FIG. 4, integrated circuit (IC) dies 50 (labelled as 50A, 50B, and 50C) are attached to the conductive pads 108 using a suitable bonding method, forming a chip-on-wafer (CoW) structure 100 with the interposer 102. In some embodiments, the IC dies 50 are attached to the interposer 102 with hybrid bonds comprising metal-metal bonds, e.g. Cu—Cu or Al—Al bonds, between the die connectors 56 and oxide-oxide bonds between the bonding layer no and a dielectric layer of the interconnect structure 58. Attaching the IC dies 50, such as e.g. HBM dies, with metal-metal or hybrid bonds rather than with solder joints may reduce insertion loss.

As an example of hybrid bonding between the IC dies 50 and the interposer 102, the hybrid bonding process starts with aligning and bonding the IC dies 50 with the interposer 102. Bonding may include applying a surface treatment to one or more of the dielectric layers 58 or the bonding layer 110. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the dielectric layers 58 or the bonding layer 110. The hybrid bonding process may then proceed to aligning die connectors 56 with the conductive pads 108. When the IC dies 50 and the interposer 102 are aligned, the die connectors 56 may overlap with the corresponding conductive pads 108. Next, the hybrid bonding includes a pre-bonding step, during which each IC die 50 is put in contact with the interposer 102. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in the die connectors 56 (e.g., copper) and the metal of the conductive pads 108 (e.g., copper) inter-diffuses to each other, and hence the direct metal-to-metal bonding is formed.

A desired type and quantity of integrated circuit dies 50 (labelled as 50A, 50B, and 50C) are attached to the interposer 102. In some embodiments, IC dies 50A are a first type of IC die, IC dies 50B are a second type of IC die, and IC dies 50C are a third type of die such as, e.g. logic dies (e.g., central processing unit (CPU), graphics processing unit (GPU), system-on-a-chip (SoC), application processor (AP), microcontroller, etc.), memory dies (e.g., dynamic random access memory (DRAM) dies, static random access memory (SRAM) dies, high bandwidth memory (HBM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), application-specific dies (e.g., an application-specific integrated circuit (ASIC), field-programmable gate array (FPGA), etc.), input/output (I/O) dies, or the like. In some embodiments, IC dies 50A are I/O dies, IC dies 50B are HBM dies, and IC dies 50C are SoC dies. Known good dies (KGDs) may be used for the IC dies 50A, 50B, and 50C to provide good system yield.

Figure 5:
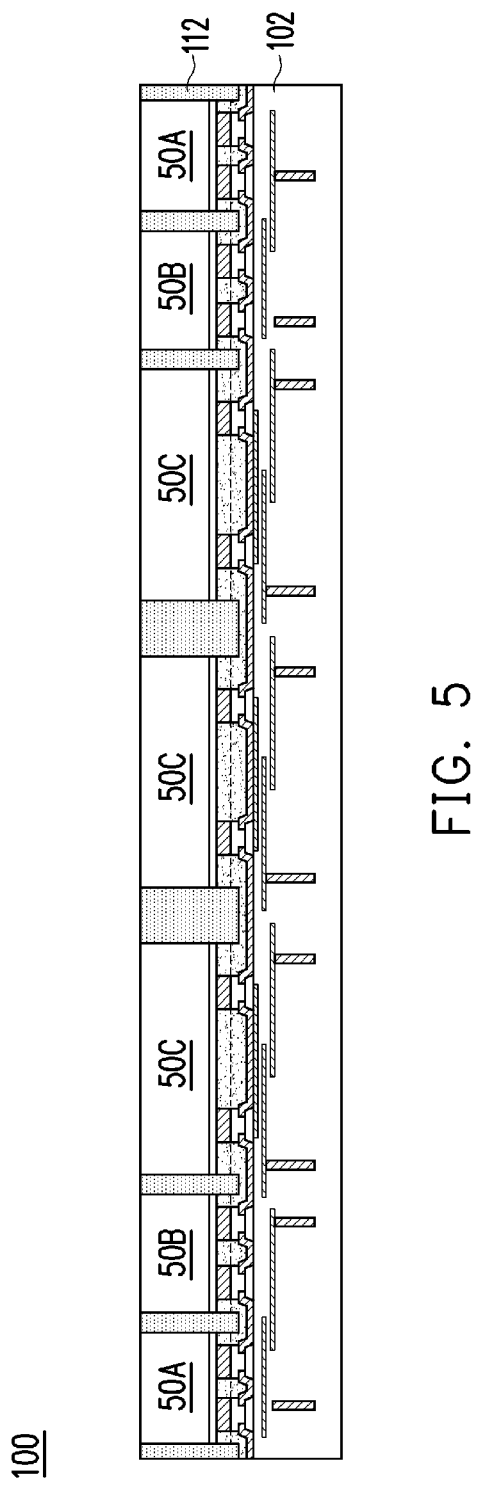

In FIG. 5, an encapsulant 112 is formed on and around the various components. After formation, the encapsulant 112 encapsulates the integrated circuit dies 50. The encapsulant 112 may be a molding compound, epoxy, or the like, and may be applied by compression molding, transfer molding, or the like. The encapsulant 112 may be applied in liquid or semi-liquid form and then subsequently cured. In some embodiments, the encapsulant 112 is formed over the interposer 102 such that the integrated circuit dies 50 are buried or covered, and a planarization process is then performed on the encapsulant 112 to expose the integrated circuit dies 50. Topmost surfaces of the encapsulant 112 and IC dies 50 are coplanar after the planarization process. The planarization process may be, for example, a chemical-mechanical polish (CMP).

Figure 6:
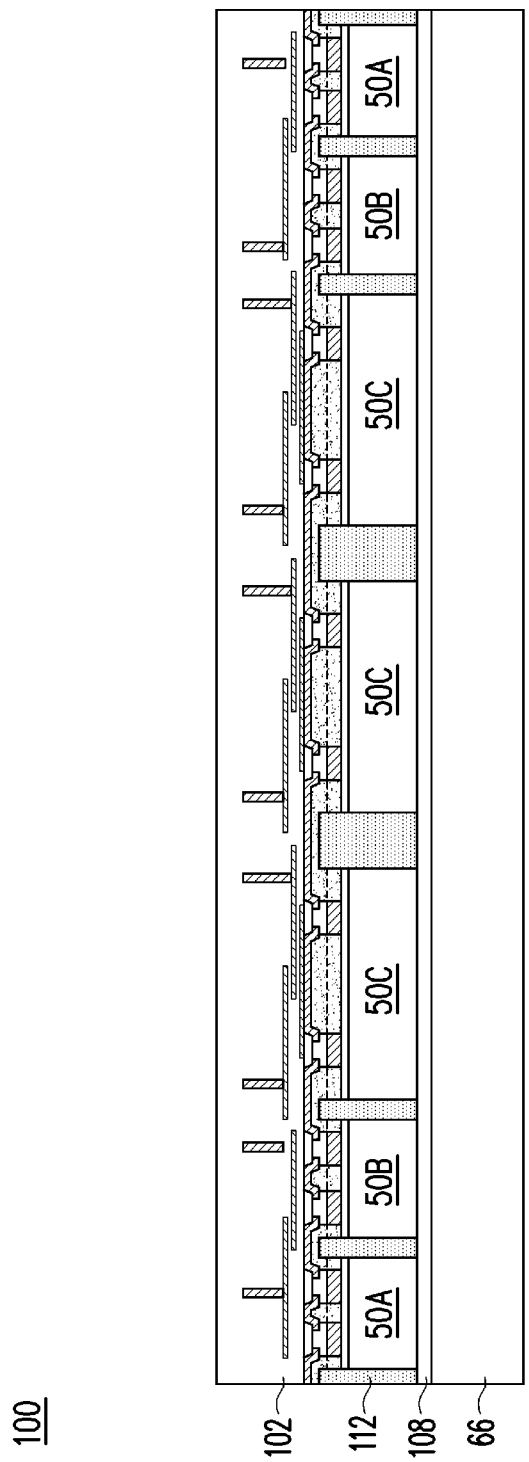

In FIG. 6, the interposer 102 and encapsulated IC dies 50 are flipped and placed on a carrier substrate 66. In some embodiments, an adhesive layer 108 is on the carrier substrate 66. The carrier substrate 66 may be a glass carrier substrate, a ceramic carrier substrate, or the like. The carrier substrate 66 may be a wafer, such that multiple packages can be formed on the carrier substrate 66 simultaneously. The adhesive layer 108 may be removed along with the carrier substrate 66 from the overlying structures that will be formed in subsequent steps. In some embodiments, the adhesive layer 108 is any suitable adhesive, epoxy, die attach film (DAF), or the like, and is applied over the surface of the carrier substrate 66.

Figure 7:
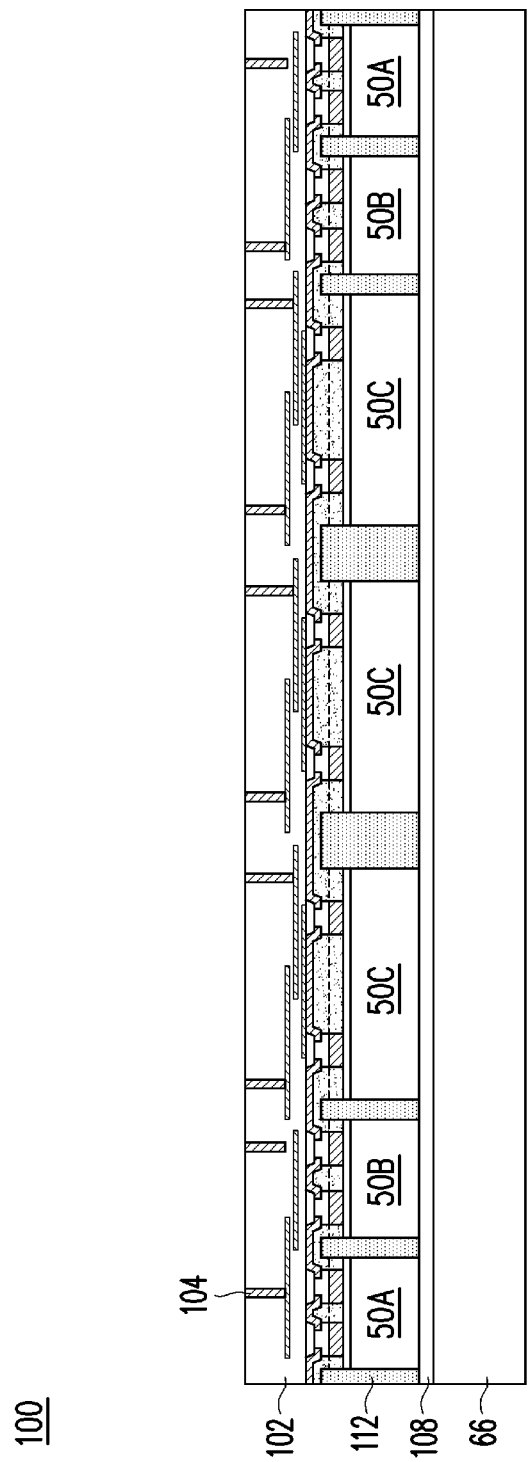

In FIG. 7, the back side of the interposer 102 (the side facing away from the carrier substrate 66) is planarized to expose top surfaces of the through substrate vias (TSVs) 104. The planarization process may be, for example, a grinding and/or a chemical-mechanical polish (CMP).

Figure 8:
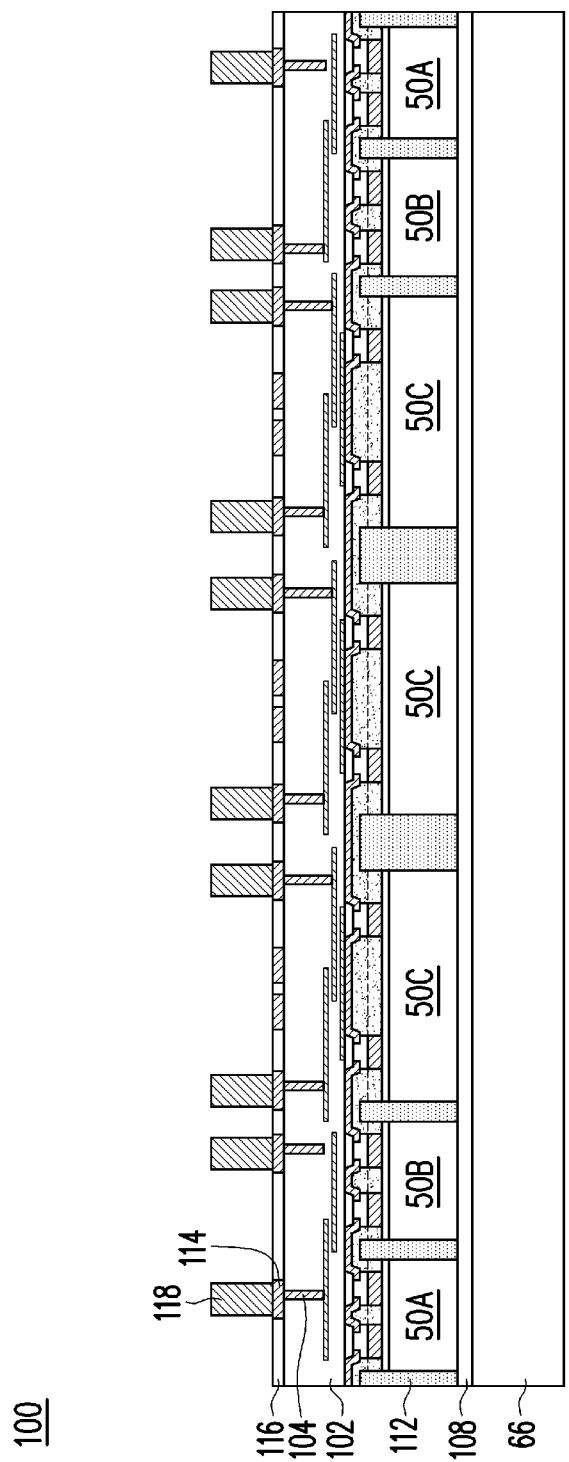

In FIG. 8, conductive pads 114, a bonding layer 116, and through dielectric vias (TDVs) 118 are formed for connection of the TSVs 104 to a subsequently formed redistribution structure 124 (see below, FIGS. 11-13). The conductive pads 114 are formed on top surfaces of the TSVs 104. As an example to form the conductive pads 114, a seed layer is formed over the interposer 102. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the conductive pads 114. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive pads 114. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

FIG. 8 further shows a bonding layer 116 formed over the interposer 102 between the conductive pads 114. The bonding layer 116 may be formed using substantially similar methods and materials as the bonding layer no as described above in reference to FIG. 3. However, any suitable method or materials may be used. After forming the bonding layer 116, a planarization process is performed on the bonding layer 116 to expose the conductive pads 114. Top surfaces of bonding layer 116 and the conductive pads 114 may be substantially coplanar after the planarization process within process variations. The planarization process may be, for example, a chemical-mechanical polish (CMP), a grinding process, or the like.

Still referring to FIG. 8, through dielectric vias (TDVs) 118 are formed on some of the conductive pads 114. As an example to form the through vias 118, a photoresist is formed and patterned on the conductive pads 114. The photoresist may be formed by spin coating or the like and may be exposed to light for patterning. The pattern of the photoresist corresponds to the subsequently formed TDVs 118. The patterning forms openings through the photoresist to expose the conductive pads 114. The TDVs 118 are formed by forming a conductive material in the openings of the photoresist and on the conductive pads 114. The conductive material of the TDVs 118 may be formed by plating, such as electroplating or electroless plating, or the like. The conductive material may comprise a metal, like copper, titanium, tungsten, aluminum, or the like. The photoresist removed, such as by an acceptable ashing or stripping process, such as using an oxygen plasma or the like, leaving the TDVs 118 extending from the conductive pads 114.

Figure 9:
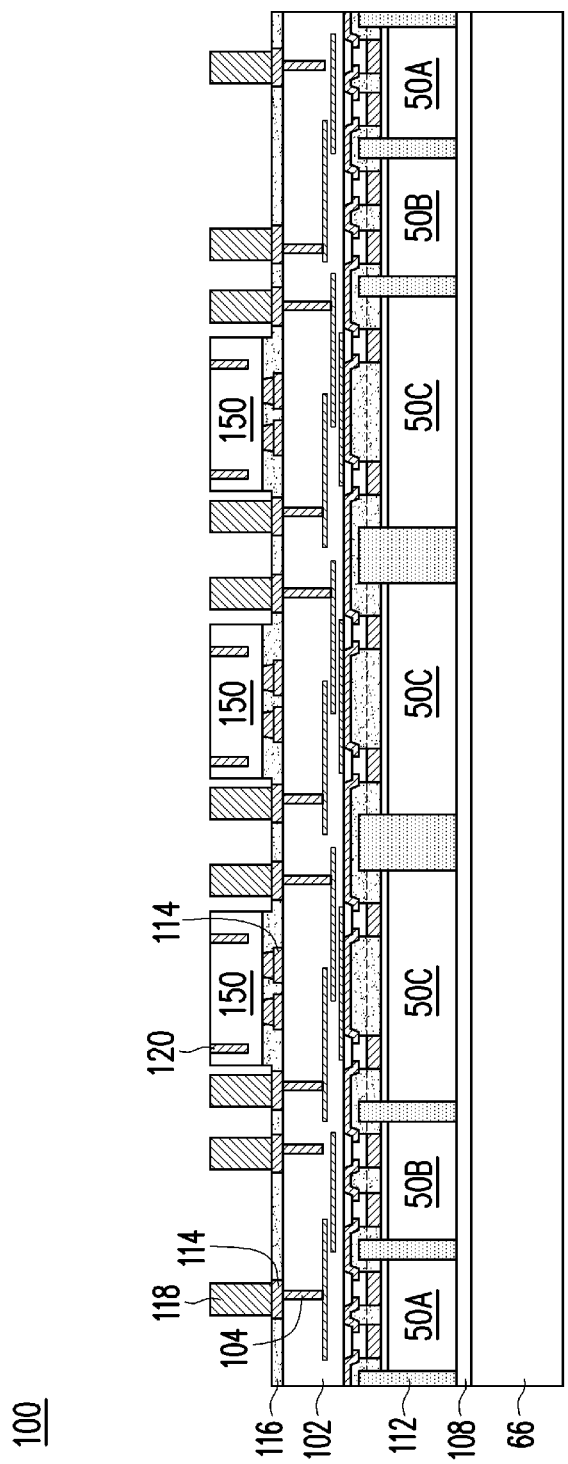

In FIG. 9, dies 150 are attached to conductive pads 114 adjacent to the TDVs 118, forming a chip-on-wafer (CoW) structure comprising the interposer 102 with chips, e.g. the dies 150, on both sides of the interposer 102. In some embodiments, the dies 150 are integrated passive device (IPD) dies comprising passive devices such as, e.g., resistors, inductors, capacitors, or the like. The dies 150 may have a substantially similar configuration as the IC die 50 described with respect to FIG. 2 but comprising passive device such as resistors, inductors, capacitors and not comprising any active devices such as, e.g., transistors. However, the dies 150 may be another suitable type of die, e.g. an IC die as described above with respect to FIG. 4. In some embodiments, the dies 150 are attached to the interposer 102 with hybrid bonds comprising metal-metal bonds, e.g. Cu—Cu bonds or Al—Al bonds, between the conductive pads die connectors 56 of the dies 150 and oxide-oxide bonds between the bonding layer 116 and a dielectric layer of the interconnect structure 58 of the dies iso. The hybrid bonding process may be substantially similar as the hybrid bonding described above with respect to FIG. 4. A desired type and quantity of dies 150 are attached to the interposer 102. In some embodiments, the dies 150 comprise through substrate vias (TSVs) 120 extending to topmost surfaces of the dies iso.

Figure 10:
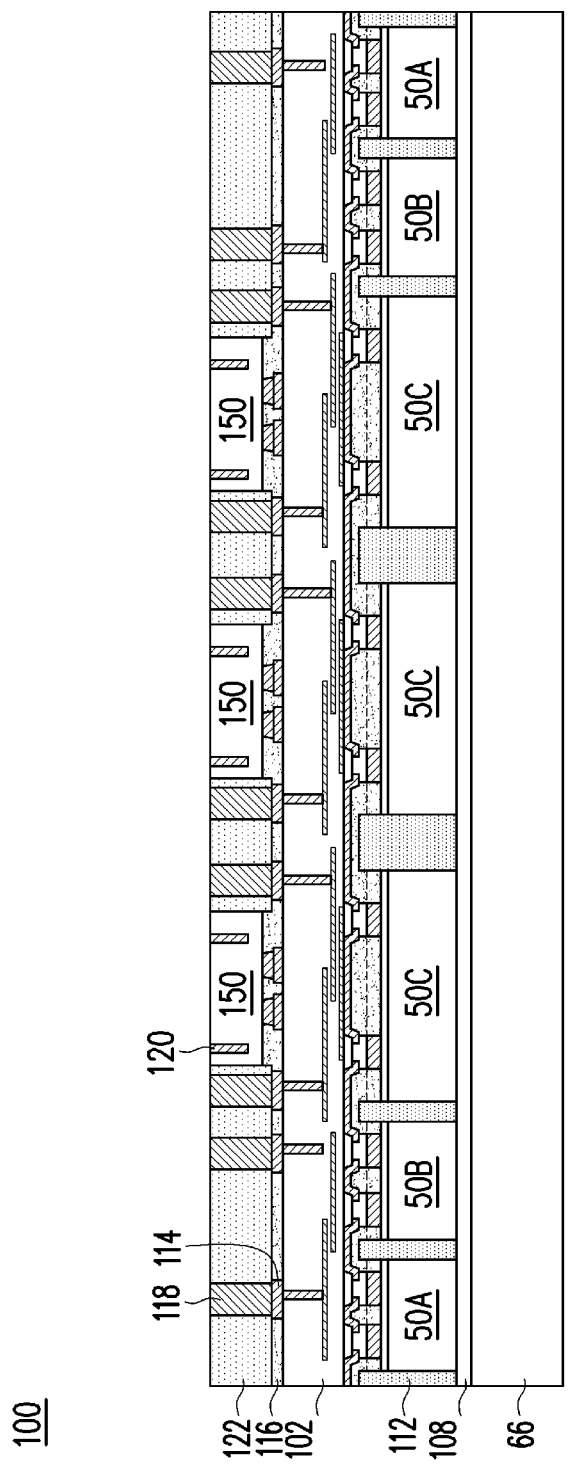

In FIG. 10, an encapsulant 122 is formed on and around the various components. After formation, the encapsulant 122 encapsulates the dies 150 and the TDVs 118. The encapsulant 122 may be a molding compound, a polymer, an epoxy, silicon oxide filler material, the like, or a combination thereof, and may be applied by compression molding, transfer molding, or the like. The encapsulant 122 may be applied in liquid or semi-liquid form and then subsequently cured. In some embodiments, the encapsulant 122 is formed such that the dies 150 and the TDVs 118 are buried or covered, and a planarization process is then performed on the encapsulant 122 to expose the TSVs 120 of the dies 150 and the TDVs 118. Topmost surfaces of the encapsulant 122, TSVs 120, and TDVs 118 are coplanar after the planarization process. The planarization process may be, for example, a chemical-mechanical polish (CMP).

Figure 11:
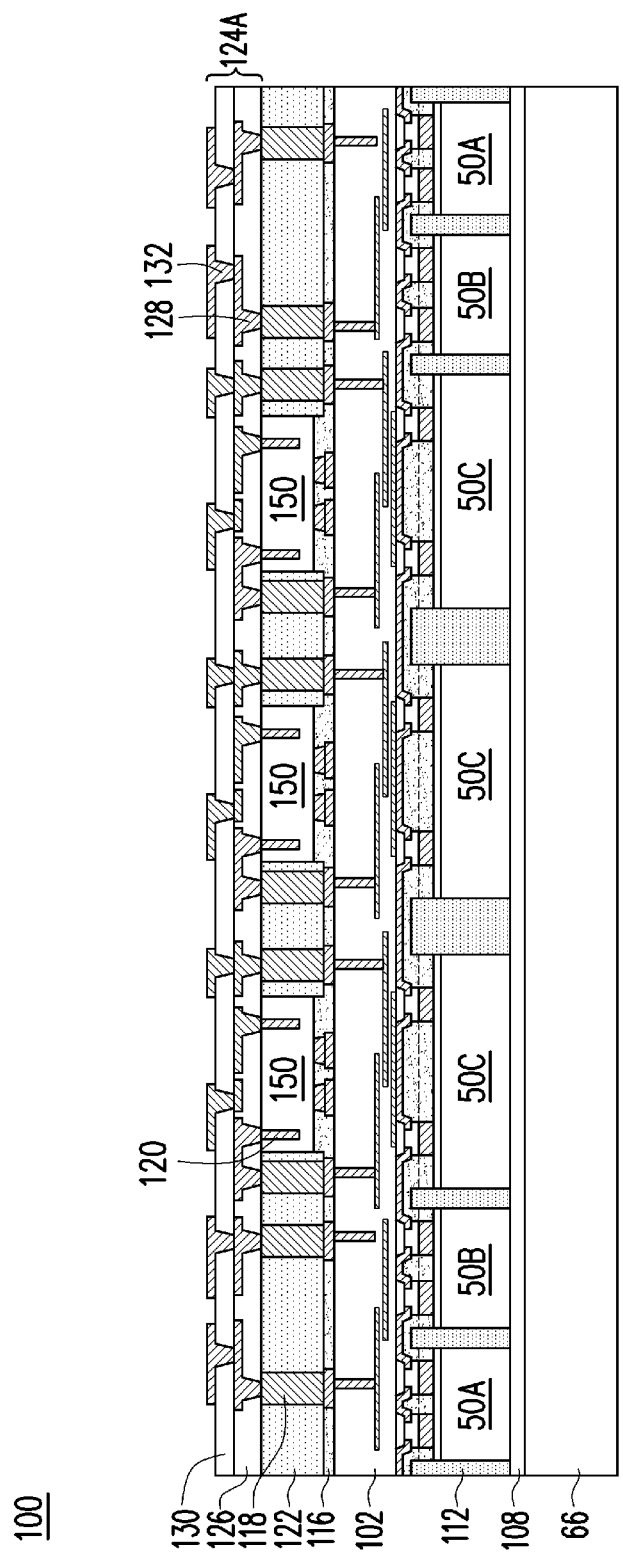

FIG. 11 illustrates the formation of a bottom portion 124A of a redistribution structure 124. The bottom portion 124A includes dielectric layers 126 and 130 and metallization patterns 128 and 132. In some embodiments, the dielectric layers 126 and 130 are formed from a same dielectric material, and are formed to a same thickness. Likewise, in some embodiments, the conductive features of the metallization patterns 128 and 132 are formed from a same conductive material, and are formed to a same thickness. Bottom portions of the metallization patterns 128 of redistribution structure 124 may have a fine pitch in a range of about 1 μm to about 50 μm, which may provide high bandwidth between interconnects of the IC dies 50.

As an example of forming the bottom portion 124A, the dielectric layer 126 is deposited on the encapsulant 122, dies iso, and TDVs 118. In some embodiments, the dielectric layer 126 is formed of a photo-sensitive material such as PBO, polyimide, BCB, or the like, which may be patterned using a lithography mask. The dielectric layer 126 may be formed by spin coating, lamination, CVD, the like, or a combination thereof. The dielectric layer 126 is then patterned. The patterning may be by an acceptable process, such as by exposing the dielectric layer 126 to light when the dielectric layer 126 is a photo-sensitive material or by etching using, for example, an anisotropic etch. If the dielectric layer 126 is a photo-sensitive material, the dielectric layer 126 can be developed after the exposure.

The metallization pattern 128 is then formed. The metallization pattern 128 has line portions (also referred to as conductive lines or traces) on and extending along the major surface of the dielectric layer 126, and has via portions (also referred to as conductive vias) extending through the dielectric layer 126 to physically and electrically couple TDVs 118 and TSVs 120. As an example to form the metallization pattern 128, a seed layer is formed over the dielectric layer 126 and in the openings extending through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 128. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 128. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 130 is then deposited on the metallization pattern 128 and dielectric layer 126. The dielectric layer 130 may be formed in a similar manner and of a similar material as the dielectric layer 126. The metallization pattern 132 is then formed. The metallization pattern 132 has line portions on and extending along the major surface of the dielectric layer 130, and has via portions extending through the dielectric layer 130 to physically and electrically couple the metallization pattern 128. The metallization pattern 132 may be formed in a similar manner and of a similar material as the metallization pattern 128.

Figure 12:
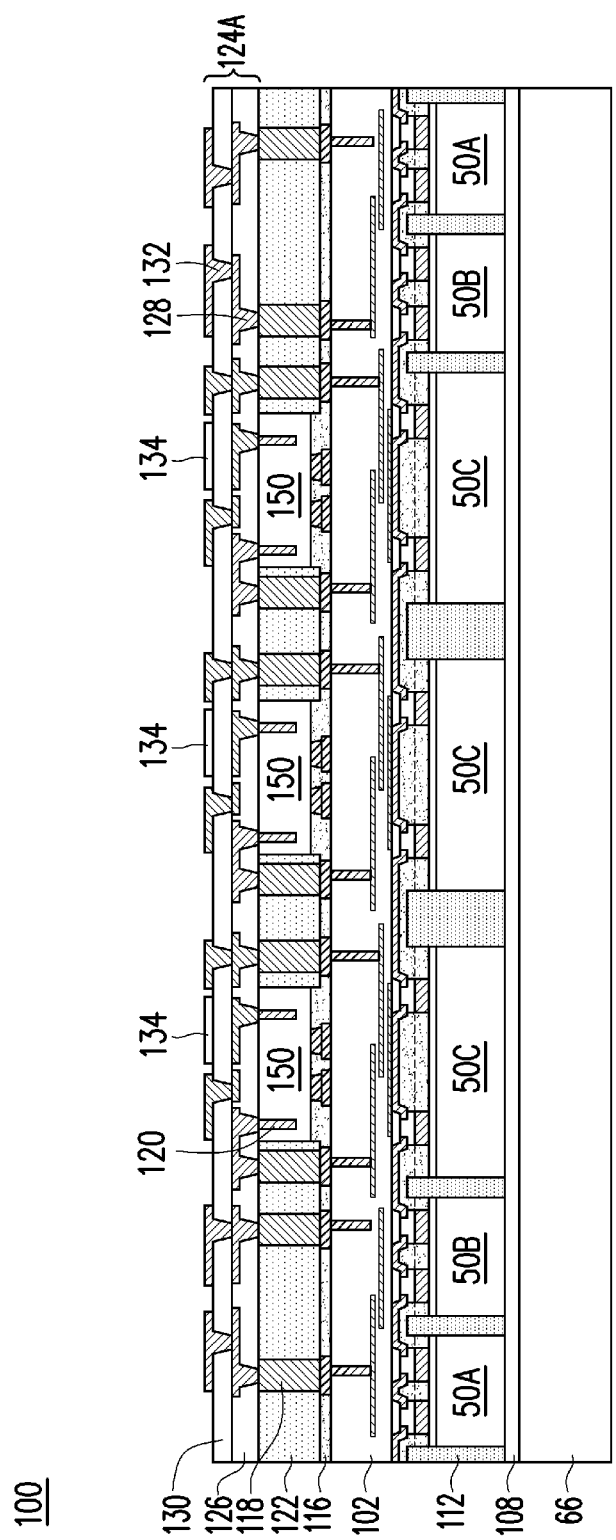

In FIG. 12, magnetic core sheets 134 are placed on the dielectric layer 130 in order to form embedded solenoid inductors in the redistribution structure 124. Forming embedded solenoid inductors in the redistribution structure 124 may be useful in order to form miniaturized voltage regulator modules (VRMs) in the redistribution structure 124, which may provide increased electrical performance due to a more compact structure. The magnetic core sheets 134 comprise a conductive material such as a metal, like copper, titanium, tungsten, aluminum, or the like. The magnetic core sheets 134 may have a height in a range of about 1 μm to about 10 μm, a width in a range of about 1 mm to about 10 mm, and a length in a range of about 1 mm to about 10 mm. In some embodiments, the magnetic core sheets 134 are copper coils.

Figure 13:
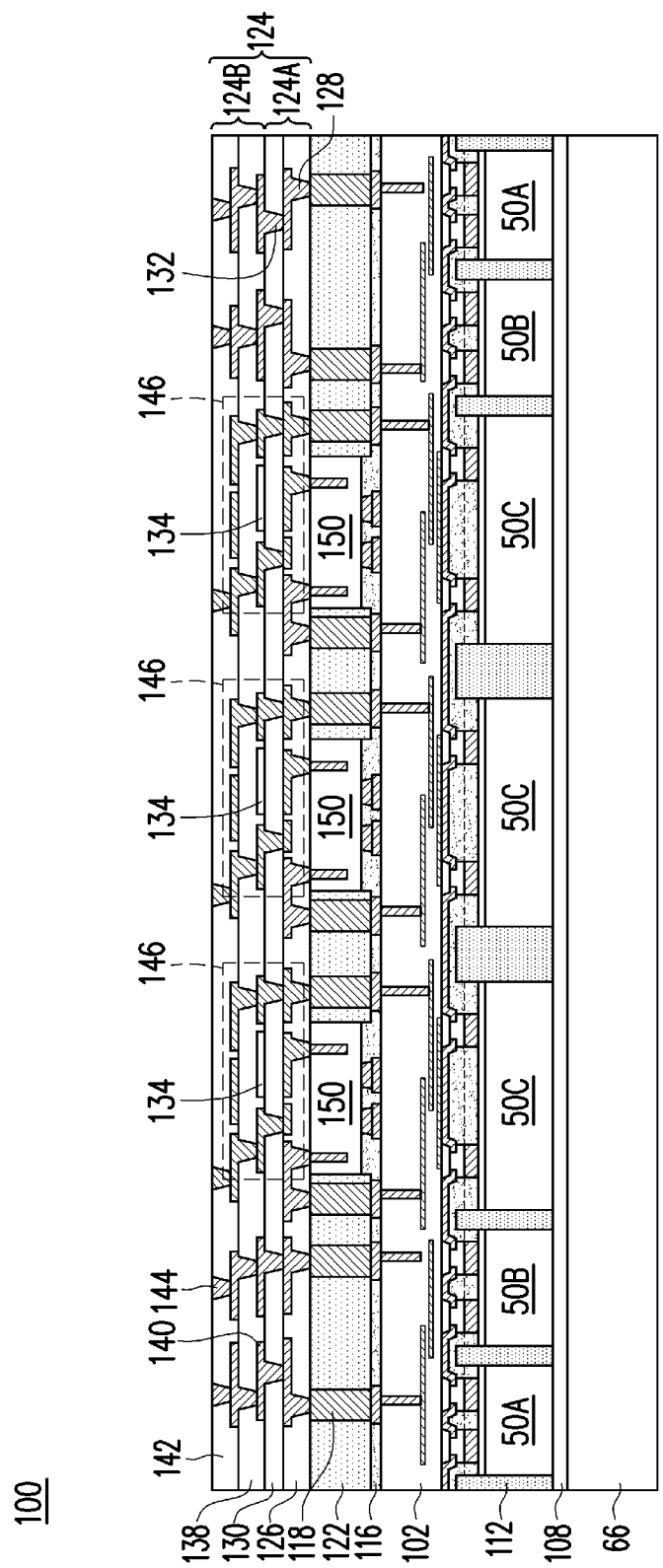

In FIG. 13, a top portion 124B of the redistribution structure 124 is formed over the bottom portion 124A, completing solenoid inductors 146 around the magnetic core sheets 134. The symmetrical molding structure of the embedded solenoid inductors 146 may prevent warpage of small components in the solenoid inductors 146, such as the magnetic core sheets 134. The top portion 124B includes dielectric layers 138 and 142 and metallization patterns 140 and 144. In some embodiments, the dielectric layers 138 and 142 are formed from a same dielectric material, and are formed to a same thickness. Likewise, in some embodiments, the conductive features of the metallization patterns 140 and 144 are formed from a same conductive material, and are formed to a same thickness.

The dielectric layer 138 is deposited on the metallization pattern 132, dielectric layer 130, and magnetic core sheets 134. The dielectric layer 138 may be formed in a similar manner and of a similar material as the dielectric layer 126. The metallization pattern 140 is then formed. The metallization pattern 140 has line portions on and extending along the major surface of the dielectric layer 138, and has via portions extending through the dielectric layer 138 to physically and electrically couple the metallization pattern 132. The metallization pattern 140 may be formed in a similar manner and of a similar material as the metallization pattern 128.

The dielectric layer 142 is then deposited on the metallization pattern 140 and the dielectric layer 138. The dielectric layer 142 may be formed in a similar manner and of a similar material as the dielectric layer 126. The metallization pattern 144 is then formed. The metallization pattern 144 has line portions on and extending along the major surface of the dielectric layer 142, and has via portions extending through the dielectric layer 142 to physically and electrically couple the metallization pattern 140. The metallization pattern 144 may be formed in a similar manner and of a similar material as the metallization pattern 128.

Solenoid inductors 146 are formed from the magnetic core sheets 134 and surrounding portions of the metallization patterns 128, 132, 140, and 144. The solenoid inductors 146 are formed to be embedded in the redistribution structure 124. This may be useful to form miniaturized voltage regulator modules (VRMs) in the redistribution structure 124. The compact structure of the embedded solenoid inductors 146 may provide increased electrical performance.

Figure 14:
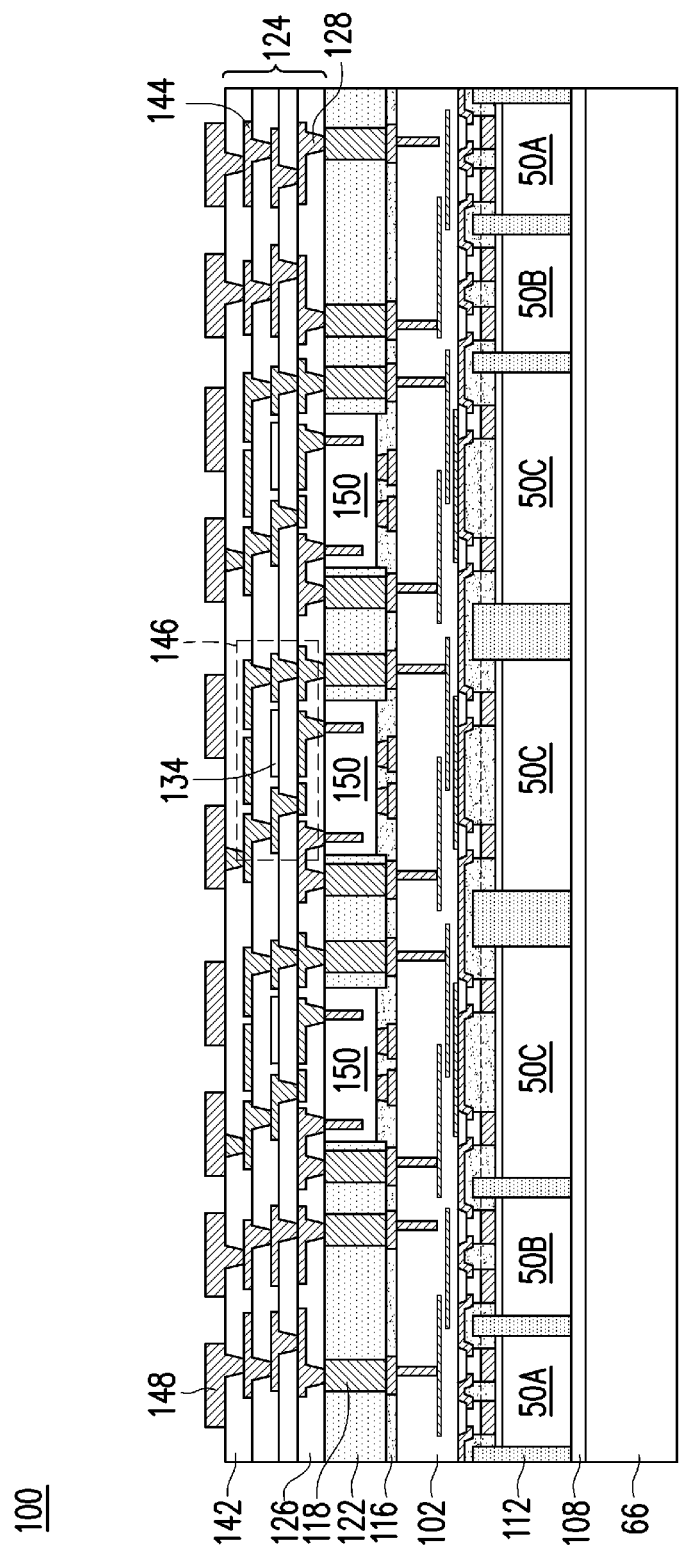

In FIG. 14, UBMs 148 that are electrically and physically coupled to the metallization pattern 144 are formed for external connection to the redistribution structure 124. The UBMs 148 have bump portions on and extending along the major surface of the dielectric layer 142. In some embodiments (not illustrated), the UBMs 148 have via portions extending through the dielectric layer 142 to physically and electrically couple the metallization pattern 144. As a result, the UBMs 148 are electrically coupled to the dies 150, the TDVs 118, and the solenoid inductors 146. The UBMs 148 may be formed in a similar manner and of a similar material as the metallization pattern 128. In some embodiments, the UBMs 148 have a different size than the metallization patterns 128, 132, 140, and 144.

Figure 15:
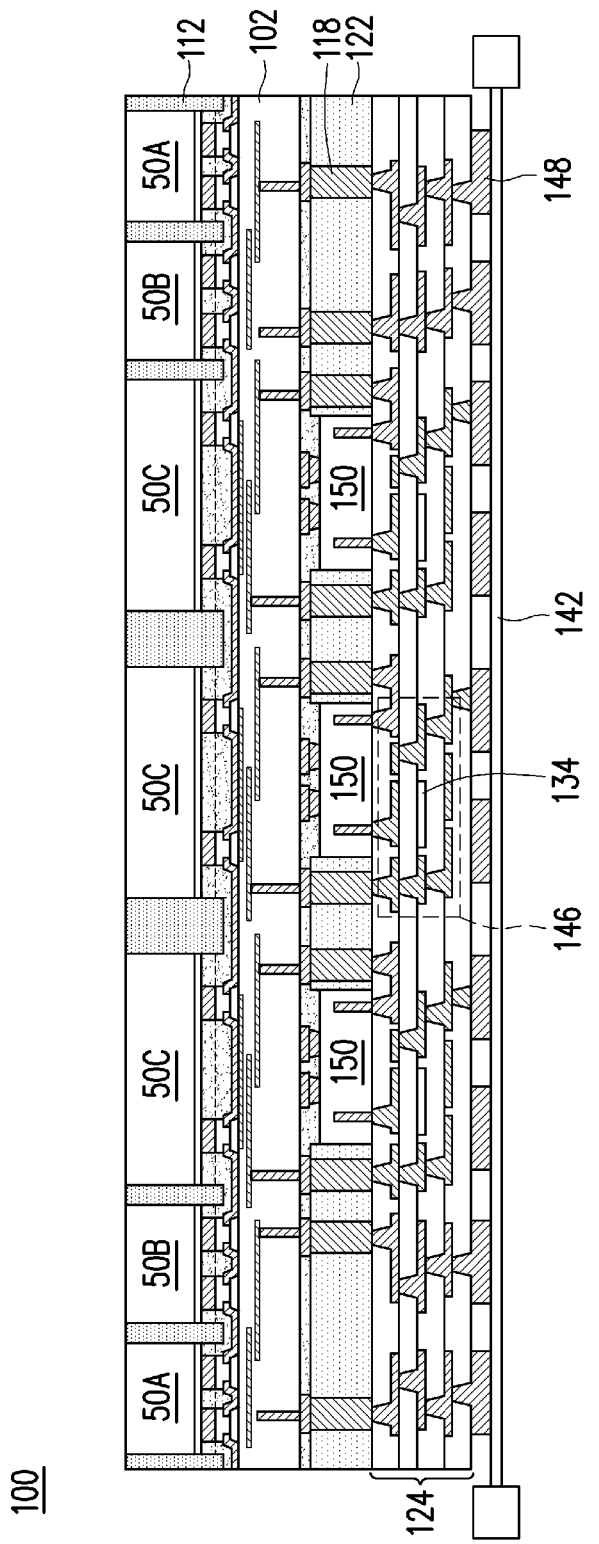

In FIG. 15, the structure is turned over and placed on a tape 142 and a carrier substrate debonding is performed to detach (or "debond") the carrier substrate 66 from the encapsulant 112 and integrated circuit dies 50. In some embodiments, the debonding includes removing the carrier substrate 66 and adhesive layer 108 by, e.g., a grinding or planarization process, such as a CMP. After removal, back side surfaces o f the integrated circuit dies 50 are exposed, and the back side surfaces of the encapsulant 112 and integrated circuit dies 50 are level. A cleaning may be performed to remove residues of the adhesive layer 108.

Figure 16:
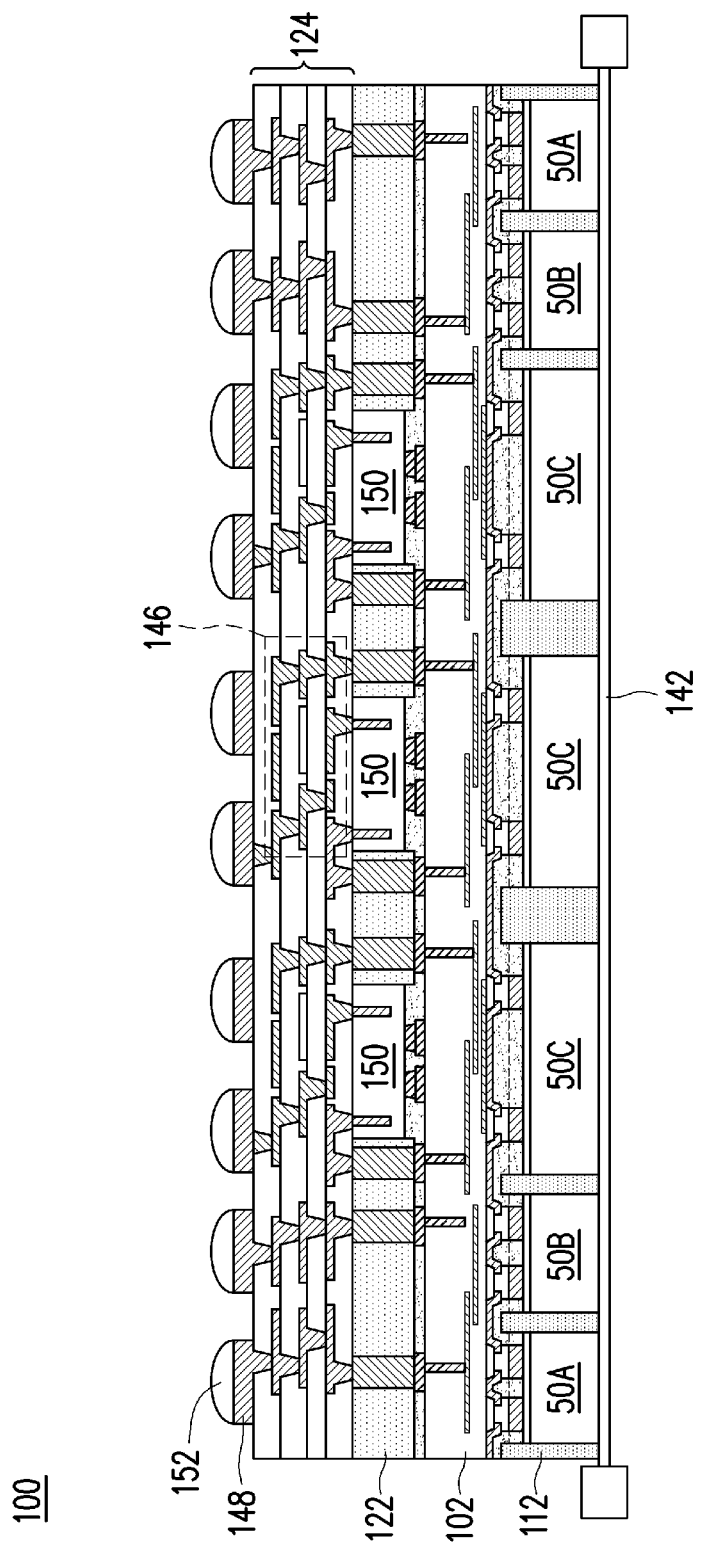

In FIG. 16, the structure is turned over again and conductive connectors 152 are formed on the UBMs 148. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 17:
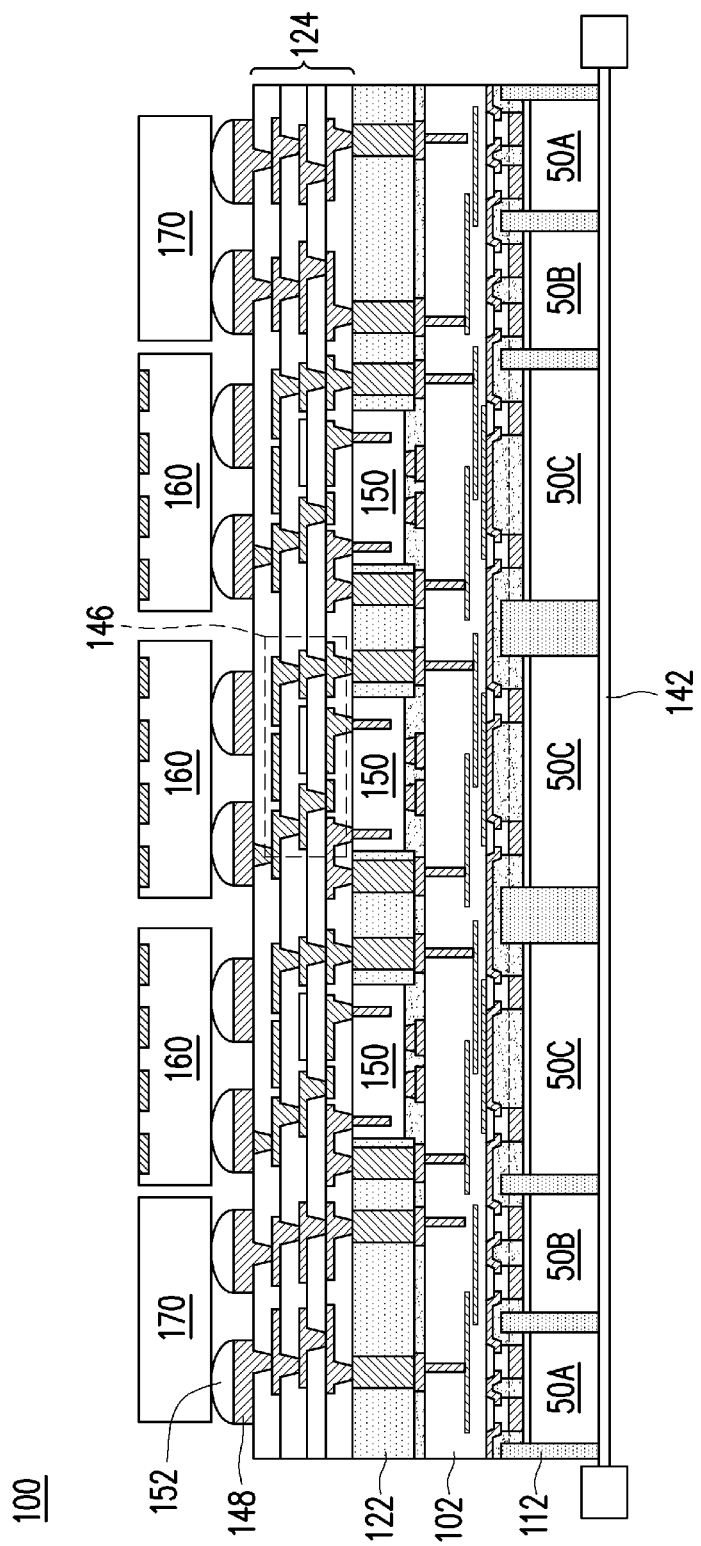

In FIG. 17, components 160 and external connectors 170 are attached to the redistribution structure 124. The components 160 may be dies, chips, or packages such as integrated fan-out (InFO) packages. In some embodiments, the components 160 comprise Pulse Width Modulation (PWM) circuits that comprise Metal Oxide Semiconductor Field Effect Transistors (MOSFETs) for power management. The external connectors 170 may include electrical and physical interfaces for the system-on-wafer 100 to external systems. For example, when the system-on-wafer 100 is installed as part of a larger external system, such as a data center, the external connectors 170 may be used to couple the system-on-wafer 170 to the external system. Examples of external connectors 170 include optical connectors (see below, FIG. 37B), receptors for ribbon cables, flexible printed circuits, or the like.

Figure 18:
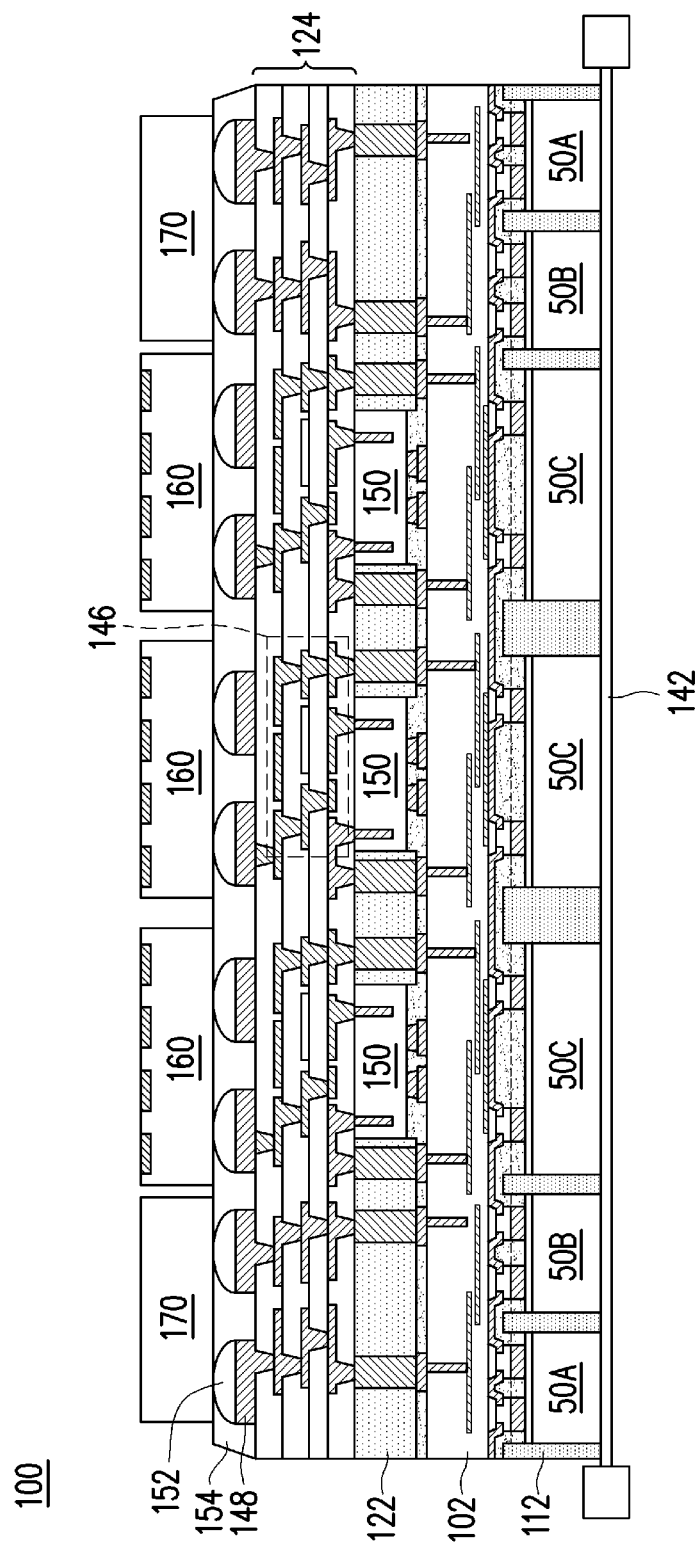

In FIG. 18, an underfill 154 may be formed to fill the gaps between the components 160 and external connectors 170 and the redistribution structure 122. The underfill 154 may be formed by a capillary flow process after the components 160 and external connectors 170 are attached, or may be formed by a suitable deposition method before the components 160 and external connectors 170 are attached.

Figure 19:
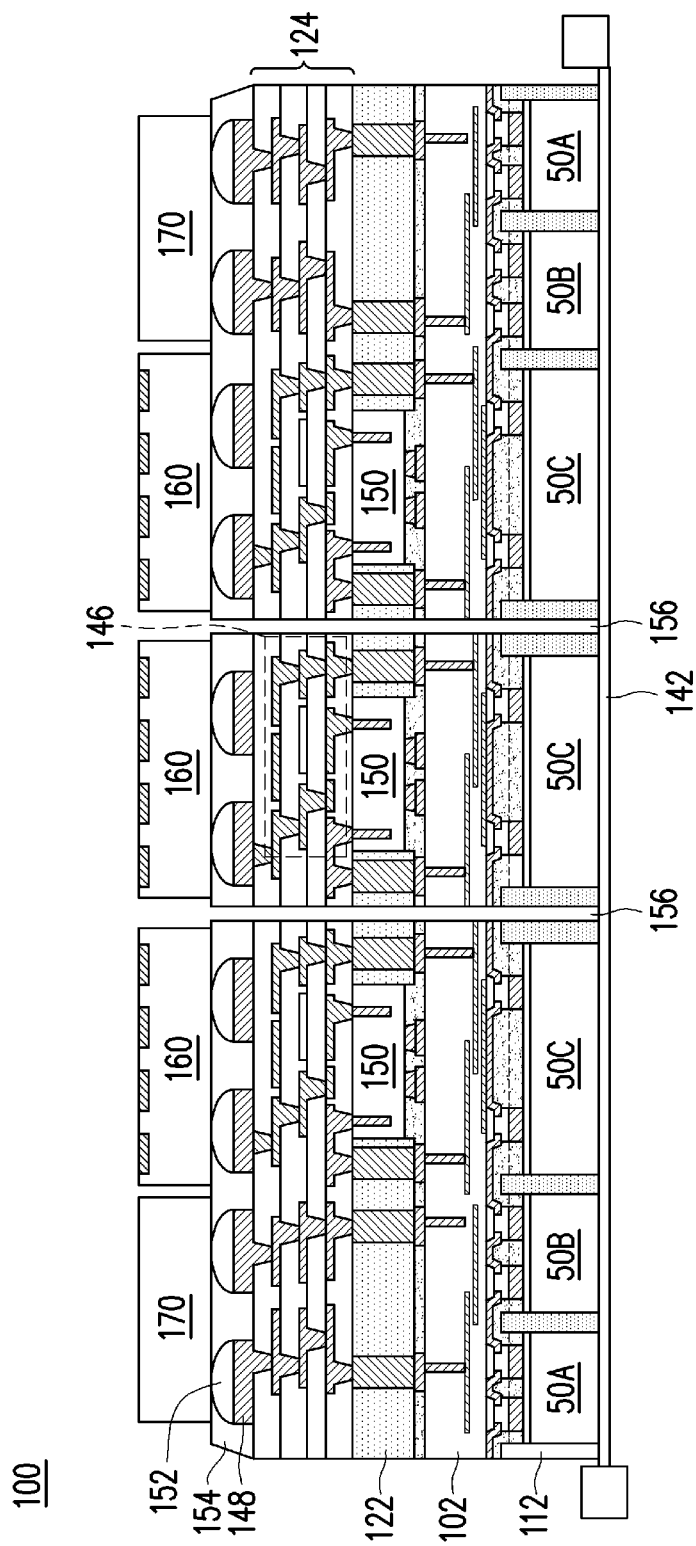

In FIG. 19, bolt holes 156 are formed through the system-on-wafer 100. The bolt holes 156 may be formed by a drilling process such as laser drilling, mechanical drilling, or the like. The bolt holes 156 may be formed by drilling an outline for the bolt holes 156 with the drilling process, and then removing the material separated by the outline. In some embodiments, the bolt holes 156 are formed earlier, such as prior to forming the conductive connectors in FIG. 16. However, the bolt holes 156 may be formed at any suitable step of the process.

Figure 20:
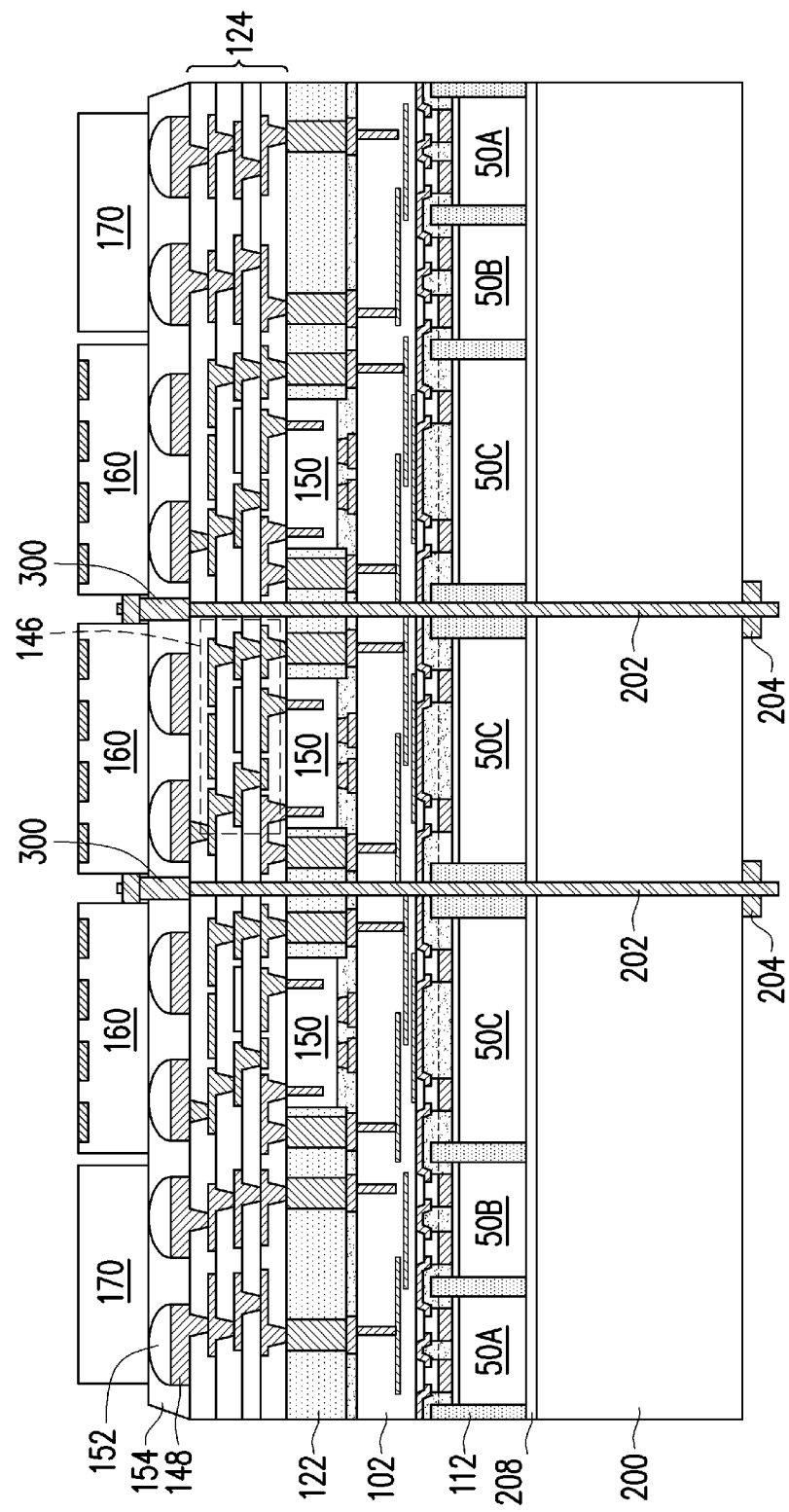
FIG. 20 illustrates a cross-sectional view of a system-on-wafer assembly, in accordance with some embodiments.

FIG. 20 illustrates a cross-sectional view of a system-on-wafer assembly, in accordance with some embodiments. The system-on-wafer assembly is formed by securing the system-on-wafer 100 between a thermal module 200 and a mechanical brace 300. The thermal module 200 may be a heat sink, a heat spreader, a cold plate, or the like. The mechanical brace 300 is a rigid support that may be formed from a material with a high stiffness, such as a metal, e.g., steel, titanium, cobalt, or the like. The mechanical brace 300 physically engages portions of the redistribution structure 124. Warpage of the system-on-wafer 100, such as that induced by carrier substrate debonding, may be reduced by clamping the system-on-wafer 100 between the thermal module 200 and mechanical brace 300. The mechanical brace 300 may be a grid that has openings exposing the components 160 and external connectors 170, for ease of module installation.

The system-on-wafer 100 is removed from the tape 142 and is fastened between the thermal module 200 and mechanical brace 300 with bolts 202. The bolts 202 are threaded through the bolt holes 144 of the system-on-wafer 100, through corresponding bolt holes in the thermal module 200, and through corresponding bolt holes in the mechanical brace 300. Fasteners 204 are threaded onto the bolts 202 and tightened to clamp the system-on-wafer 100 between the thermal module 200 and mechanical brace 300. The fasteners 204 may be, e.g., nuts that thread to the bolts 202. The fasteners 204 attach to the bolts 202 at both sides of the system-on-wafer assembly (e.g., at the side having the thermal module 200 (sometimes referred to as the back side) and at the side having the mechanical brace 300 (sometimes referred to as the front side)). After being attached, portions of the mechanical brace 300 are disposed between the components 160 and/or the external connectors 170.

Before fastening together the various components, a thermal interface material (TIM) 208 may be dispensed on the back side of the system-on-wafer 100, physically and thermally coupling the thermal module 200 to the integrated circuit dies 50. In some embodiments, the TIM 206 is formed of a film comprising indium and a HM03 type material. During fastening, the fasteners 204 are tightened, thereby increasing the mechanical force applied to the system-on-wafer 100 by the thermal module 200 and the mechanical brace 300. The fasteners 204 are tightened until the thermal module 200 exerts a desired amount of pressure on the TIM 206.

Figure 21:
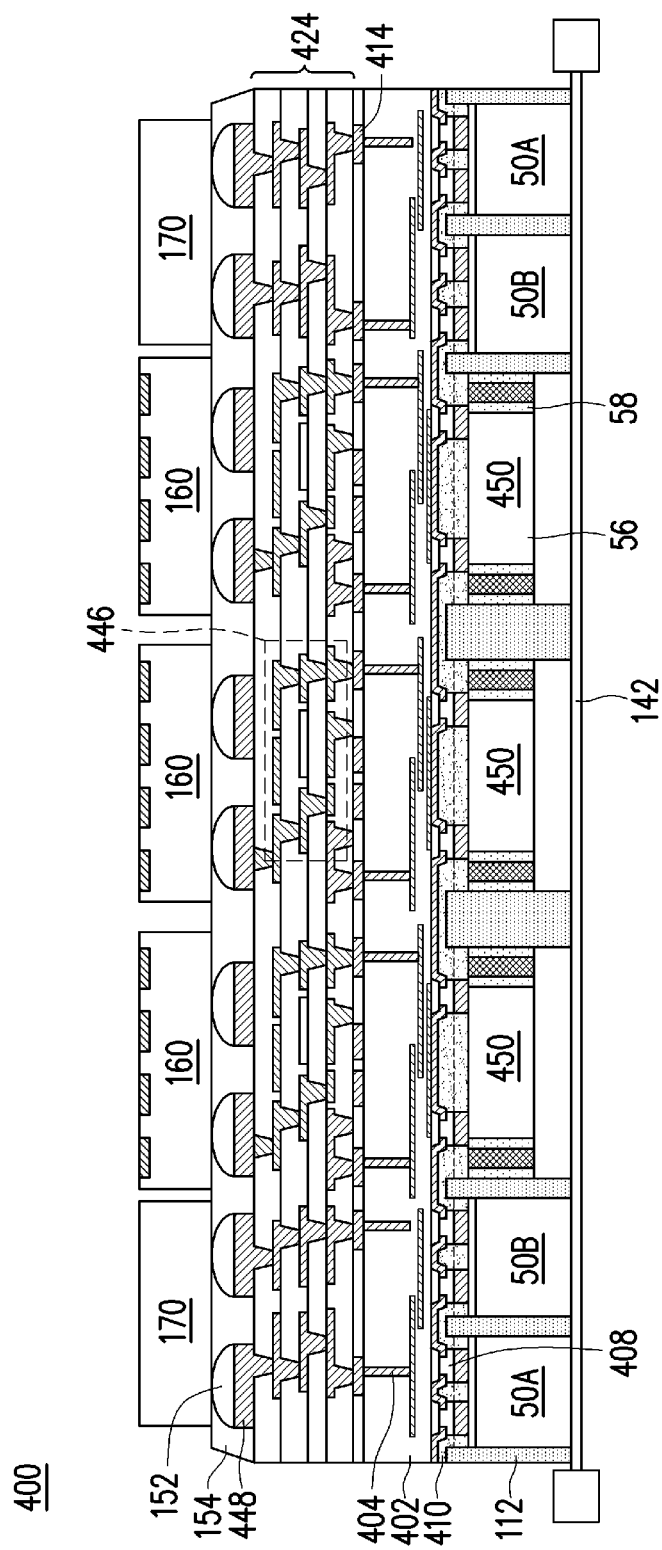
FIG. 21 illustrates a cross-sectional view of another system-on-wafer, in accordance with some embodiments.

FIG. 21 illustrates a system-on-wafer 400, in accordance with some alternate embodiments. The system-on-wafer 400 may be similar to the system-on-wafer 100 described above in reference to FIGS. 1 and FIGS. 4-19 where like reference numerals indicate like elements formed using like processes. Integrated circuit (IC) dies 50 (labeled 50A and 50B) and packages 450 are encapsulated by an encapsulant 112. In some embodiments, the IC dies 50A are input/output (I/O) dies, the IC dies 50B are stacked high bandwidth memory (HBM) devices that each include multiple memory dies, and the IC dies 50E are hybrid SRAM/SoC dies that comprise SoC circuitry, SRAM circuitry, and through substrate vias (TSVs) that may electrically couple the IC dies 50E to a wafer scale interposer 102 over the IC dies 50A, 50B, and 50E and the encapsulant 112. Conductive pads 408 and a bonding layer 410 are on a side of the interposer 402 facing the IC dies 50. The interposer 402 may comprise a bulk silicon wafer with active and/or passive components, such as e.g. diodes, capacitors, inductors, resistors and the like (not shown) formed in the interposer 402. Conductive pads 414 are physically and electrically coupled to through substrate vias (TSVs) 404 for connection of the IPD circuitry to a redistribution structure 424, also referred to as an interconnect structure 424, on the interposer 402. The redistribution structure 424 physically and electrically couples the interposer 402 with components 160 and external connectors 170 on a top side of the redistribution structure 124. The redistribution structure 424 comprises solenoid inductors 446, which may function as miniaturized voltage regulator modules (VRMs) to provide increased electrical performance. The components 160 may be may be InFO packages comprising, e.g., PWM circuits for power management and MOSFETs. The external connectors 170 may be electrical and physical interfaces for the system-on-wafer 400 to external systems such as optical connectors (see below, FIG. 37B).

Figure 22:
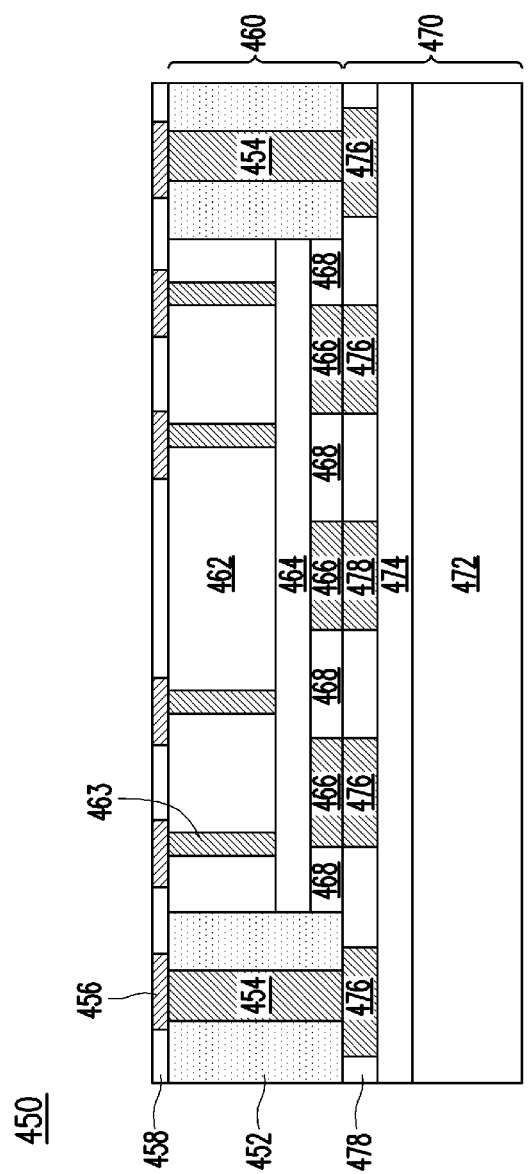
FIG. 22 illustrates a cross-sectional view of a package, in accordance with some embodiments.

FIG. 22 illustrates a cross-sectional view of a package 450, in accordance with some embodiments. The package 450 comprises an IC die 460 stacked on and bonded to another IC die 470. The IC die 460 may be a memory die (e.g., dynamic random access memory (DRAM) die, static random access memory (SRAM) die, etc.), a power management die (e.g., power management integrated circuit (PMIC) die), and the IC die 470 may be a logic die e.g., central processing unit (CPU), graphics processing unit (GPU), system-on-a-chip (SoC), application processor (AP), microcontroller, etc.). In some embodiments, the IC die 460 is an SRAM die and the IC die 470 is a SoC die.

In some embodiments, the IC dies 460 and 470 have similar structures and materials as the IC die 50 described above with respect to FIG. 2. The IC die 460 has a semiconductor substrate 462, an interconnect structure 464 over the semiconductor substrate 462, die connectors 466 physically and electrically coupled to the interconnect structure 464, and a dielectric layer 468 over the interconnect structure 464 and laterally encapsulating the die connectors 466. The IC die 460 may also have through substrate vias (TSVs) 463 extending through the semiconductor substrate 462 and physically and electrically coupling the interconnect structure 464. The IC die 470 has a semiconductor substrate 472, an interconnect structure 474 over the semiconductor substrate 472, die connectors 476 physically and electrically coupled to the interconnect structure 474, and a dielectric layer 478 over the interconnect structure 474 and laterally encapsulating the die connectors 476.

The IC die 460 and the IC die 470 may be bonded by a suitable bonding method between the respective dielectric layers 468 and 478 and the respective die connectors 466 and 476, such as hybrid bonding. The hybrid bonding may be performed in a similar manner as the hybrid bonding between the IC dies 50 and the interposer 102 as described above with respect to FIG. 4.

After bonding the die 460 to the IC die 470, through dielectric vias (TDVs) 454 are formed on the die connectors 476. The TDVs 454 may be formed in a similar manner as the TDVs 118 as described above with respect to FIG. 8. The IC die 46o and the TDVs 454 are then encapsulated by an encapsulant 452, which may be formed in a similar manner as the encapsulant 112 as described above with respect to FIG. 5. In some embodiments, the encapsulant 452 is formed over the IC die 460 and the TDVs 454 such that the IC die 460 and the TDVs 454 are buried or covered, and a planarization process is then performed on the encapsulant 452 to expose the TDVs 454 and the TSVs 463 of the IC die 460. Topmost surfaces of the encapsulant 452, TDVs 454, semiconductor substrate 462, and the TSVs 463 are coplanar after the planarization process. The planarization process may be, for example, a chemical-mechanical polish (CMP).

Conductive pads 456 are then formed over top surfaces of the TDVs 454 and the TSVs 463 and a bonding layer is formed over the encapsulant 452 and the semiconductor substrate 462 between the conductive pads 456. The conductive pads 456 and the bonding layer 458 may be formed using substantially similar methods and materials as the conductive pads 108 and the bonding layer no as described above in reference to FIG. 3. However, any suitable method or materials may be used. The conductive pads 456 and the bonding layer 458 may allow package 450, comprising the IC dies 460 and 470, to be hybrid bonded to, e.g., an interposer 402 as described below with respect to FIG. 24. The conductive pads 456 may be electrically connected to the TDVs 454 as well as circuitry of the IC dies 460 and 470.

FIGS. 23-35 illustrate cross-sectional views of intermediate steps during a process for forming a system-on-wafer 400 as shown above in FIG. 21, in accordance with some embodiments. As such, the system-on-wafer 400 is large. For example, the system-on-wafer 400 can have a surface area in excess of 10,000 mm².

Figure 23:
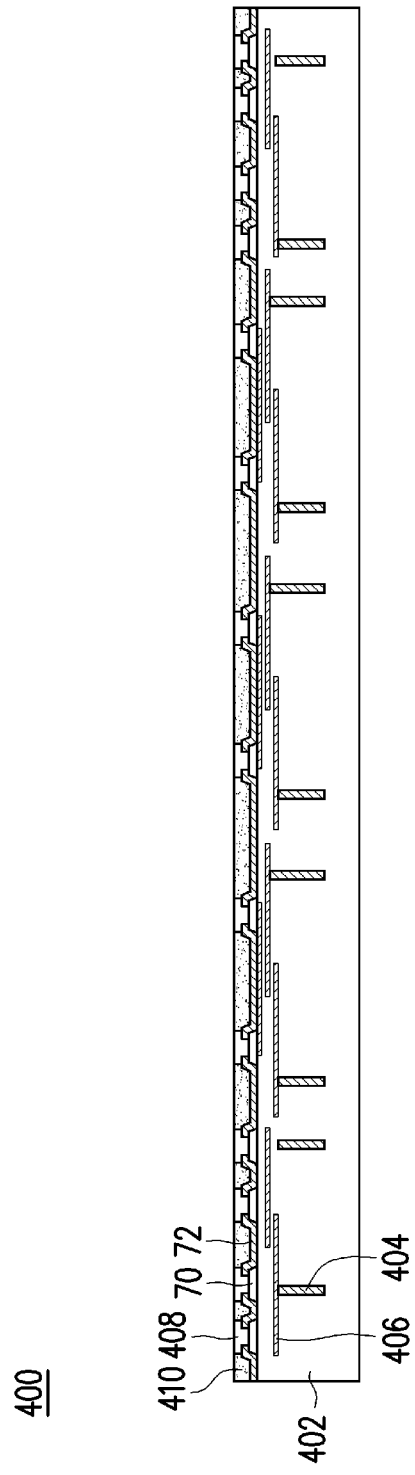
FIGS. 23-35 illustrate cross-sectional views of intermediate steps during a process for forming a system-on-wafer, in accordance with some embodiments.

In FIG. 23, conductive pads 408 and a bonding layer 410 are formed on a wafer scale interposer 402. The interposer 402 may be a semiconductor substrate or wafer. The interposer 402 may comprises a bulk silicon wafer. In some embodiments, the interposer 402 may comprise any semiconductor substrate, ceramic substrate, quartz substrate, or the like. In some embodiments, interposer 102 comprises a silicon-on-insulator (SOI) or other composite wafer. In some embodiments, various metal interconnect features, such as through substrate vias (TSVs) 404 and conductive features 406 are embedded in the interposer 402. The conductive features 406 may include embedded passive components, such as resistors, inductors, capacitors, and the like (not shown). In some embodiments, the interposer 402 may be free of any active components such as transistors, or the like.

Further referring to FIG. 23, a passivation layer 72 is disposed on a top surface of the interposer 402, and input/output (I/O) pads 70 are exposed at a top surface of the passivation layer 72. The I/O pads 70 are physically and electrically coupled to the conductive features 406 and may comprise a conductive material such as, e.g., copper, titanium, tungsten, aluminum, or the like. The passivation layer 72 may be a polymer such as PBO, polyimide, BCB, or the like; a nitride such as silicon nitride or the like; an oxide such as silicon oxide, PSG, BSG, BPSG, or the like; the like, or a combination thereof. The passivation layer 72 may be formed, for example, by spin coating, lamination, chemical vapor deposition (CVD), or the like.

Still referring to FIG. 23, conductive pads 408 are formed on the I/O pads 70 for connection of the metallization pattern 72 to subsequently attached IC dies (see below, FIG. 24). The conductive pads 408 are formed on top surfaces of the IPD components 60 or the metallization pattern 62. The conductive pads 108 may exhibit fine pitches, which may provide high bandwidth between subsequently attached IC dies 50 (see below, FIG. 24) and passive devices, such as e.g. capacitors, embedded in the interposer 102. The conductive pads 408 may be formed with substantially similar methods and materials as the conductive pads 108 as described above with respect to FIG. 4.

FIG. 23 further shows a bonding layer 410 formed over the interposer 402 between the conductive pads 408. The bonding layer 410 may be formed with substantially similar methods and materials as the bonding layer no as described above with respect to FIG. 4. However, any suitable methods or materials may be used. After forming the bonding layer 410, a planarization process is performed on the bonding layer 410 to expose the conductive pads 408. Top surfaces of the bonding layer 410 and the conductive pads 408 may be substantially coplanar after the planarization process within process variations. The planarization process may be, for example, a chemical-mechanical polish (CMP), a grinding process, or the like.

Figure 24:
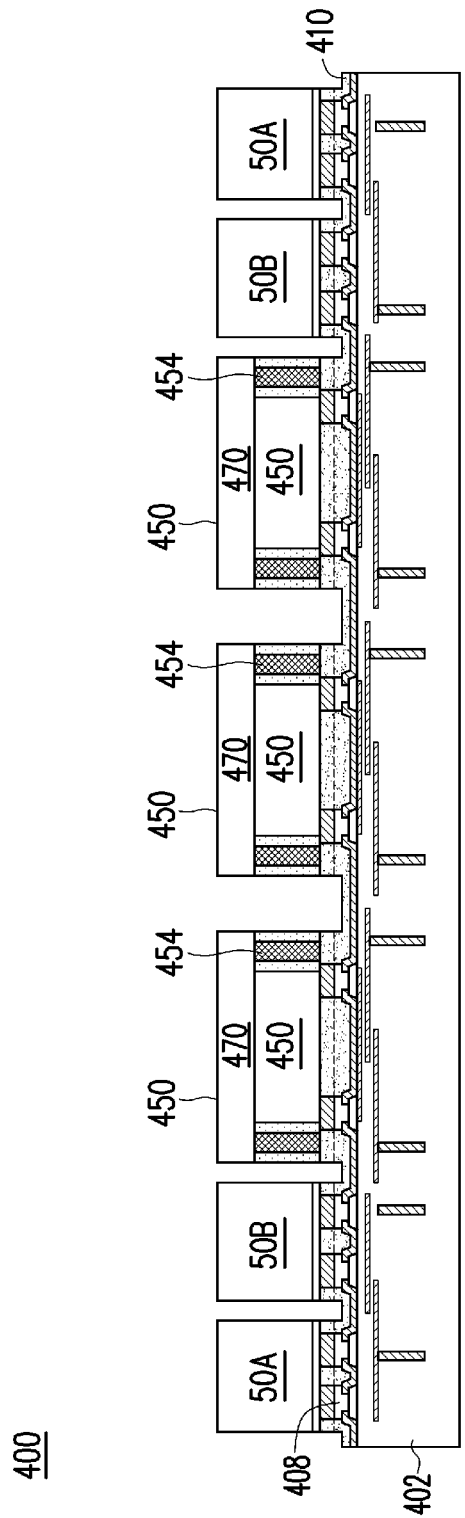

In FIG. 24, integrated circuit (IC) dies 50 (labeled as 50A and 50B) and packages 450 (see above, FIG. 22) are attached to the conductive pads 408 using a suitable bonding method, forming a chip-on-wafer (CoW) structure 400 with the interposer 402. In some embodiments, the IC dies 50 and the packages 450 are attached to the interposer 402 with hybrid bonds comprising metal-metal bonds, e.g. Cu—Cu bonds or Al—Al bonds, between the die connectors 56 and the conductive pads 408 and between the conductive pads 456 and the conductive pads 408, oxide-oxide bonds between the bonding layer no and the dielectric 58 of the IC dies 50 and between the bonding layer no and the bonding layer 456 of the packages 450. Attaching the IC dies 5o, such as e.g. HBM dies, and the packages 450 with metal-metal or hybrid bonds rather than with solder joints may reduce insertion loss. The hybrid bonding process may be substantially similar as the hybrid bonding described above with respect to FIG. 4. A desired type and quantity of integrated circuit dies 50 and packages 450 are attached to the interposer 402. In some embodiments, IC dies 50A are a first type of IC die and IC dies 50B are a second type of IC die such as, e.g. logic dies (e.g., central processing unit (CPU), graphics processing unit (GPU), system-on-a-chip (SoC), application processor (AP), microcontroller, etc.), memory dies (e.g., dynamic random access memory (DRAM) dies, static random access memory (SRAM) dies, high bandwidth memory (HBM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), application-specific dies (e.g., an application-specific integrated circuit (ASIC), field-programmable gate array (FPGA), etc.), input/output (I/O) dies, integrated passive device (IPD) dies, or the like. In some embodiments, IC dies 50A are I/O dies, and IC dies 50B are HBM dies. Known good dies (KGDs) may be used for the IC dies 50A and 50B to provide good system yield.

Figure 25:
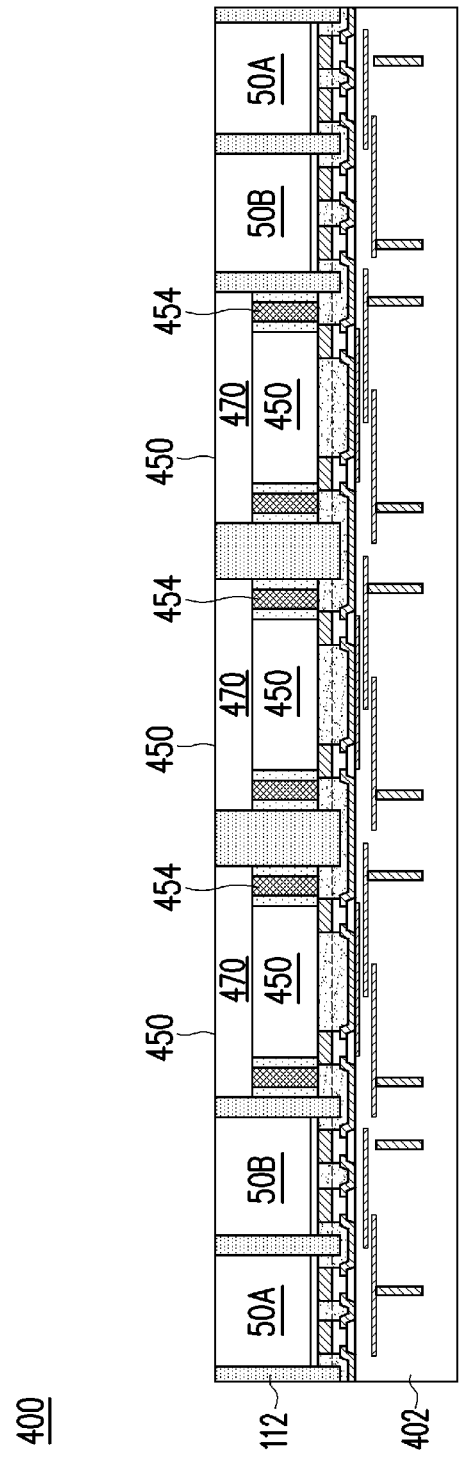

In FIG. 25, an encapsulant 112 is formed on and around the various components. After formation, the encapsulant 112 encapsulates the integrated circuit dies 50 and packages 450. The encapsulant 112 may be a molding compound, epoxy, or the like, and may be applied by compression molding, transfer molding, or the like. The encapsulant 112 may be applied in liquid or semi-liquid form and then subsequently cured. In some embodiments, the encapsulant 112 is formed over the interposer 402 such that the integrated circuit dies 50 and the packages 450 are buried or covered, and a planarization process is then performed on the encapsulant 112 to expose the integrated circuit dies 50 and the packages 450. Topmost surfaces of the encapsulant 112, IC dies 50, and packages 450 are coplanar after the planarization process. The planarization process may be, for example, a chemical-mechanical polish (CMP).

Figure 26:
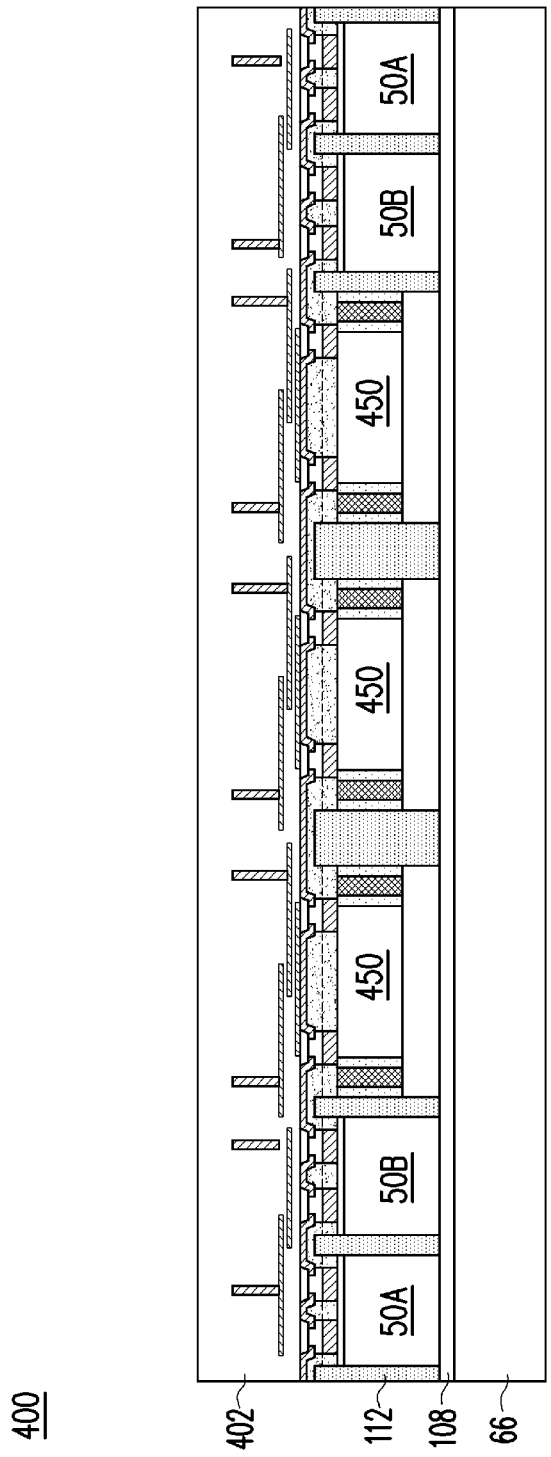

In FIG. 26, the interposer 402 and encapsulated IC dies 50 and packages 450 are flipped and placed on a carrier substrate 66. In some embodiments, an adhesive layer 108 is on the carrier substrate 66. The carrier substrate 66 may be a glass carrier substrate, a ceramic carrier substrate, or the like. The carrier substrate 66 may be a wafer, such that multiple packages can be formed on the carrier substrate 66 simultaneously. The adhesive layer 108 may be removed along with the carrier substrate 66 from the overlying structures that will be formed in subsequent steps. In some embodiments, the adhesive layer 108 is any suitable adhesive, epoxy, die attach film (DAF), or the like, and is applied over the surface of the carrier substrate 66.

Figure 27:
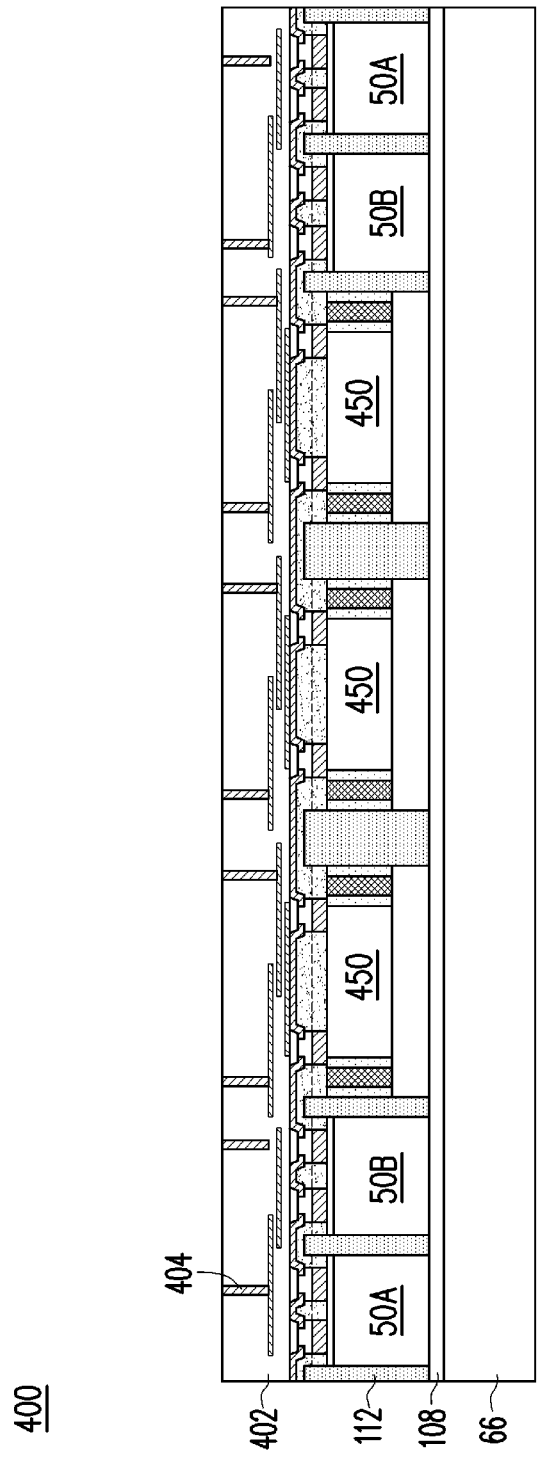

In FIG. 27, the back side of the interposer 402 (the side facing away from the carrier substrate 66) is planarized to expose top surfaces of the through substrate vias (TSVs) 404. The planarization process may be, for example, a grinding and/or a chemical-mechanical polish (CMP).

Figure 28:
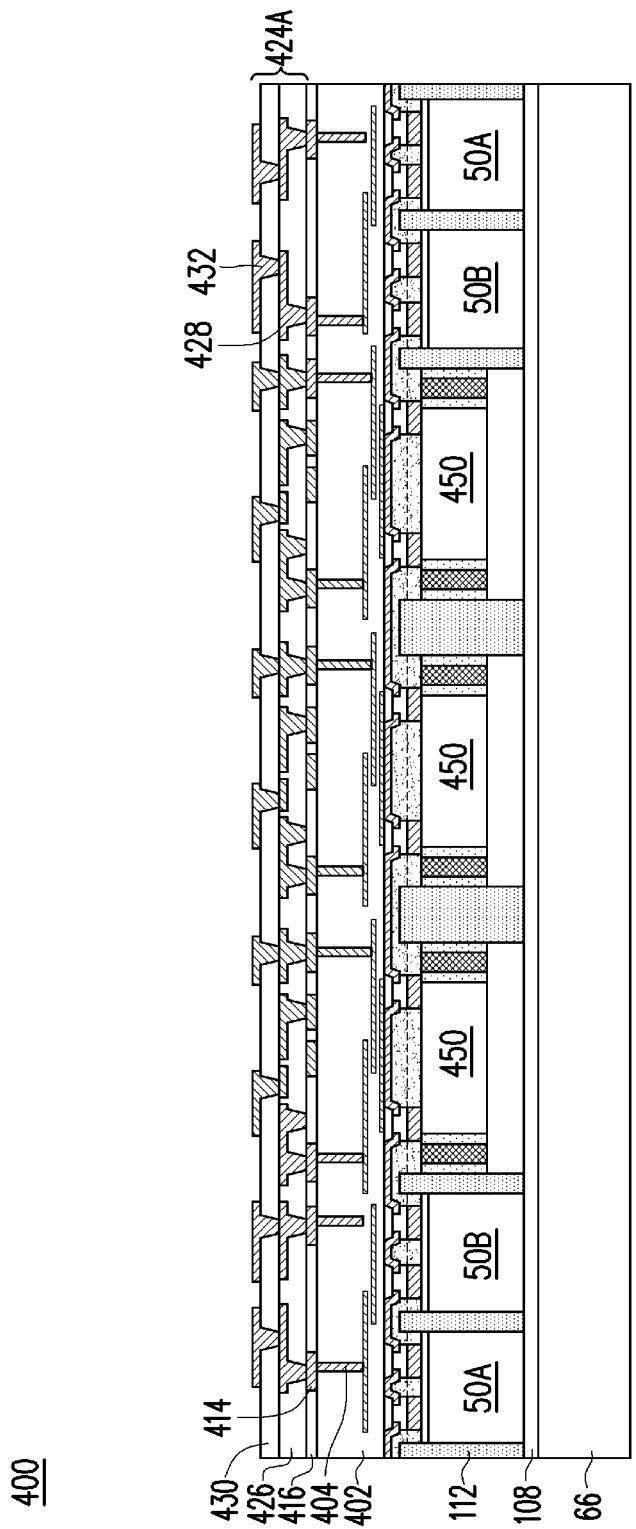

FIG. 28 illustrates the formation of a bottom portion 424A of a redistribution structure 424. The bottom portion 424A includes dielectric layers 414, 426, and 430 and metallization patterns 416, 428, and 432. In some embodiments, the dielectric layers 414, 426, and 430 are formed from a same dielectric material, and are formed to a same thickness. Likewise, in some embodiments, the conductive features of the metallization patterns 416, 428, and 432 are formed from a same conductive material, and are formed to a same thickness. Bottom portions of the metallization patterns 416 of the redistribution structure 424 may have a fine pitch in a range of about 10 μm to about 100 μm, which may provide high bandwidth between interconnects of the IC dies 50.

As an example of forming the bottom portion 424A, the dielectric layer 41426 is deposited on the back side of the interposer 402. In some embodiments, the dielectric layer 414 is formed of a photo-sensitive material such as PBO, polyimide, BCB, or the like, which may be patterned using a lithography mask. The dielectric layer 414 may be formed by spin coating, lamination, CVD, the like, or a combination thereof. The dielectric layer 414 is then patterned. The patterning may be by an acceptable process, such as by exposing the dielectric layer 414 to light when the dielectric layer 414 is a photo-sensitive material or by etching using, for example, an anisotropic etch. If the dielectric layer 414 is a photo-sensitive material, the dielectric layer 414 can be developed after the exposure.

The metallization pattern 416 is then formed. The metallization pattern 416 has line portions (also referred to as conductive lines or traces) on and extending along the major surface of the dielectric layer 414, and has via portions (also referred to as conductive vias) extending through the dielectric layer 414426 to physically and electrically couple the TSVs 404. As an example to form the metallization pattern 416, a seed layer is formed over the dielectric layer 416 and in the openings extending through the dielectric layer 416 to top surfaces of the TSVs 404. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 416. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 416. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 426 is then deposited on the metallization pattern 416 and dielectric layer 414. The dielectric layer 426 may be formed in a similar manner and of a similar material as the dielectric layer 414. The metallization pattern 428 is then formed. The metallization pattern 428 has line portions on and extending along the major surface of the dielectric layer 426, and has via portions extending through the dielectric layer 426 to physically and electrically couple the metallization pattern 416. The metallization pattern 428 may be formed in a similar manner and of a similar material as the metallization pattern 416.

The dielectric layer 430 is then deposited on the metallization pattern 428 and dielectric layer 426. The dielectric layer 430 may be formed in a similar manner and of a similar material as the dielectric layer 414. The metallization pattern 432 is then formed. The metallization pattern 432 has line portions on and extending along the major surface of the dielectric layer 430, and has via portions extending through the dielectric layer 430 to physically and electrically couple the metallization pattern 428. The metallization pattern 432 may be formed in a similar manner and of a similar material as the metallization pattern 416.

Figure 29:
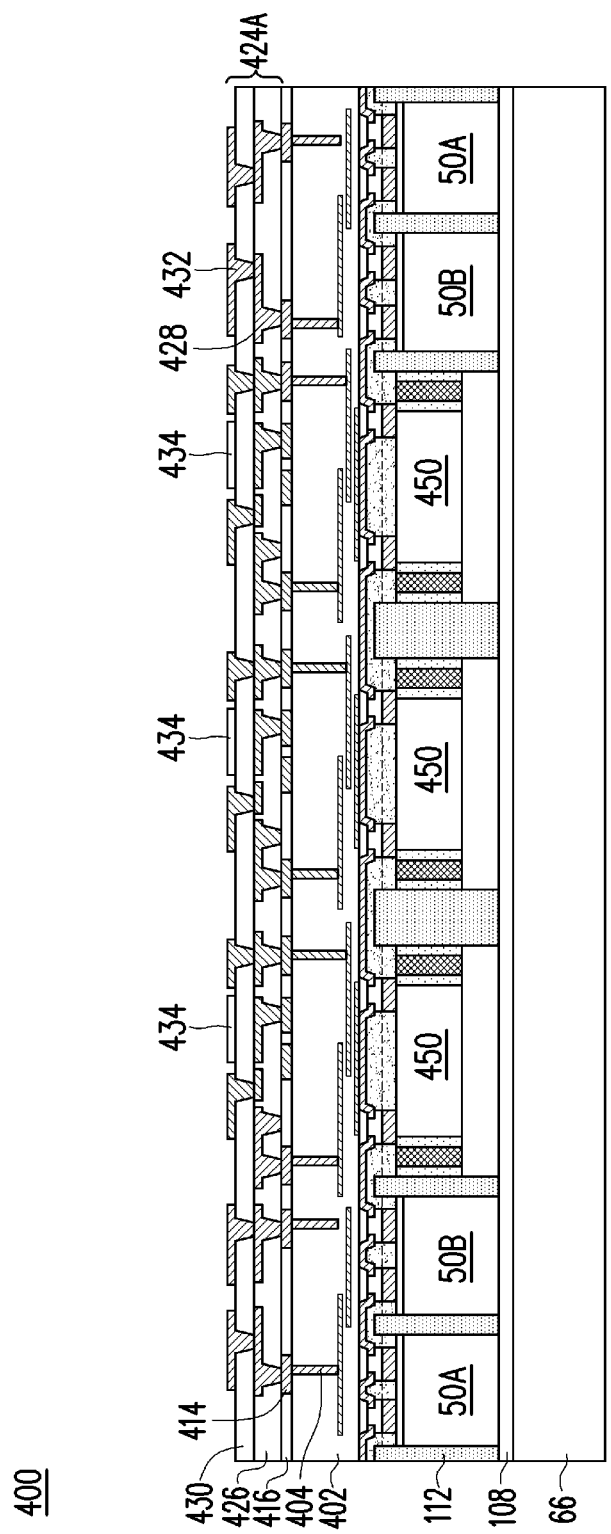

In FIG. 29, magnetic core sheets 434 are placed on the dielectric layer 430 in order to form embedded solenoid inductors in the redistribution structure 424. Forming embedded solenoid inductors in the redistribution structure 424 may be useful in order to form miniaturized voltage regulator modules (VRMs) in the redistribution structure 424, which may provide increased electrical performance due to a more compact structure. The magnetic core sheets 434 comprise a conductive material such as a metal, like copper, titanium, tungsten, aluminum, or the like. The magnetic core sheets 434 may have a height in a range of about 1 μm to about 10 μm, a width in a range of about 1 mm to about 10 mm, and a length in a range of about 1 mm to about 10 mm. In some embodiments, the magnetic core sheets 434 are copper coils.

Figure 30:
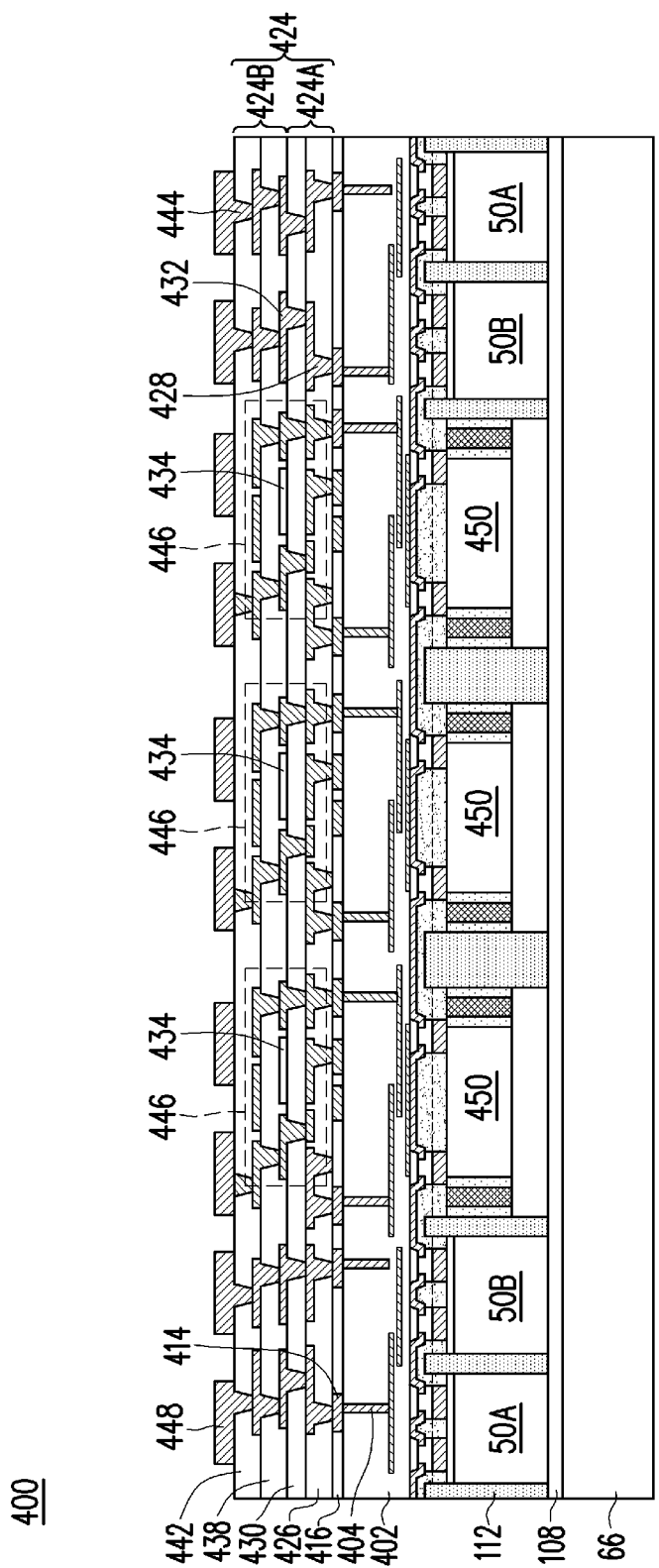

In FIG. 30, a top portion 424B of the redistribution structure 424 is formed over the bottom portion 424A, completing solenoid inductors 446 around the magnetic core sheets 434, and UBMs 448 are formed on the redistribution structure 424. The symmetrical molding structure of the embedded solenoid inductors 446 may prevent warpage of small components in the solenoid inductors 446, such as the magnetic core sheets 434. The top portion 424B includes dielectric layers 438 and 442 and metallization patterns 440 and 444. In some embodiments, the dielectric layers 438 and 442 are formed from a same dielectric material, and are formed to the same thickness as each other, such as in a range of about 1 μm to about 50 μm. Likewise, in some embodiments, the conductive features of the metallization patterns 440 and 444 are formed from a same conductive material, and are formed to a same thickness as each other, such as in a range of about 1 μm to about 30 μm.

The dielectric layer 438 is deposited on the metallization pattern 432, dielectric layer 430, and magnetic core sheets 434. The dielectric layer 438 may be formed in a similar manner and of a similar material as the dielectric layer 414. The metallization pattern 440 is then formed. The metallization pattern 440 has line portions on and extending along the major surface of the dielectric layer 438, and has via portions extending through the dielectric layer 438 to physically and electrically couple the metallization pattern 432.

The metallization pattern 440 may be formed in a similar manner and of a similar material as the metallization pattern 416.

The dielectric layer 442 is then deposited on the metallization pattern 440 and the dielectric layer 438. The dielectric layer 142 may be formed in a similar manner and of a similar material as the dielectric layer 414. The metallization pattern 444 is then formed. The metallization pattern 444 has line portions on and extending along the major surface of the dielectric layer 442, and has via portions extending through the dielectric layer 442 to physically and electrically couple the metallization pattern 440. The metallization pattern 444 may be formed in a similar manner and of a similar material as the metallization pattern 416.

Solenoid inductors 446 are formed from the magnetic core sheets 434 and surrounding portions of the metallization patterns 428, 432, 440, and 444. The solenoid inductors 446 are formed to be embedded in the redistribution structure 424. This may be useful to form miniaturized voltage regulator modules (VRMs) in the redistribution structure 424. The compact structure of the embedded solenoid inductors 446 may provide increased electrical performance.

Further referring to FIG. 30, UBMs 148 that are electrically and physically coupled to the metallization pattern 444 are formed for external connection to the redistribution structure 424. The UBMs 448 have bump portions on and extending along the major surface of the dielectric layer 442. In some embodiments (not illustrated), the UBMs 448 have via portions extending through the dielectric layer 442 to physically and electrically couple the metallization pattern 444. As a result, the UBMs 448 are electrically coupled to the solenoid inductors 446 and the interposer 402. The UBMs 448 may be formed in a similar manner and of a similar material as the metallization pattern 416. In some embodiments, the UBMs 448 have a different size than the metallization patterns 416, 428, 432, 440, and 444.

Figure 31:
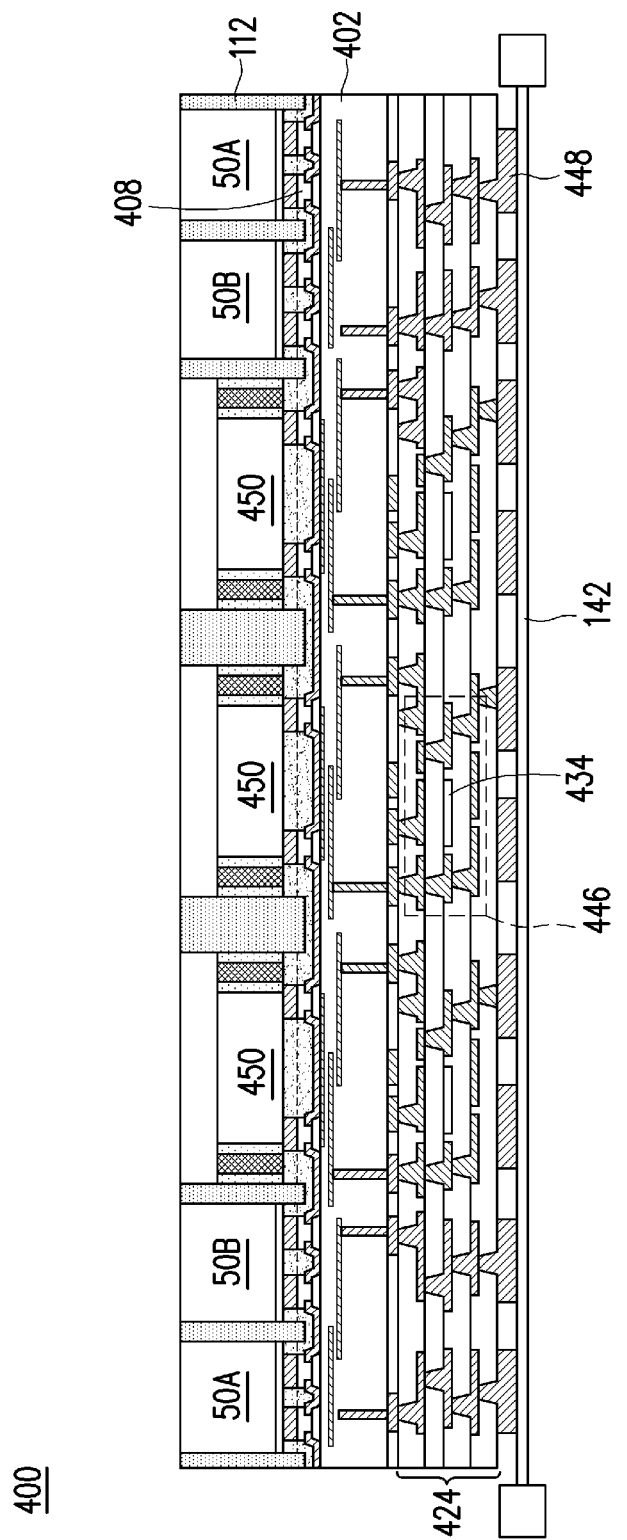

In FIG. 31, the structure is turned over and placed on a tape 142 and a carrier substrate debonding is performed to detach (or "debond") the carrier substrate 66 from the encapsulant 112 and integrated circuit dies 50. In some embodiments, the debonding includes removing the carrier substrate 66 and adhesive layer 108 by, e.g., a grinding or planarization process, such as a CMP. After removal, back side surfaces of the integrated circuit dies 50 are exposed, and the back side surfaces of the encapsulant 112 and integrated circuit dies 50 are level. A cleaning may be performed to remove residues of the adhesive layer 108.

Figure 32:
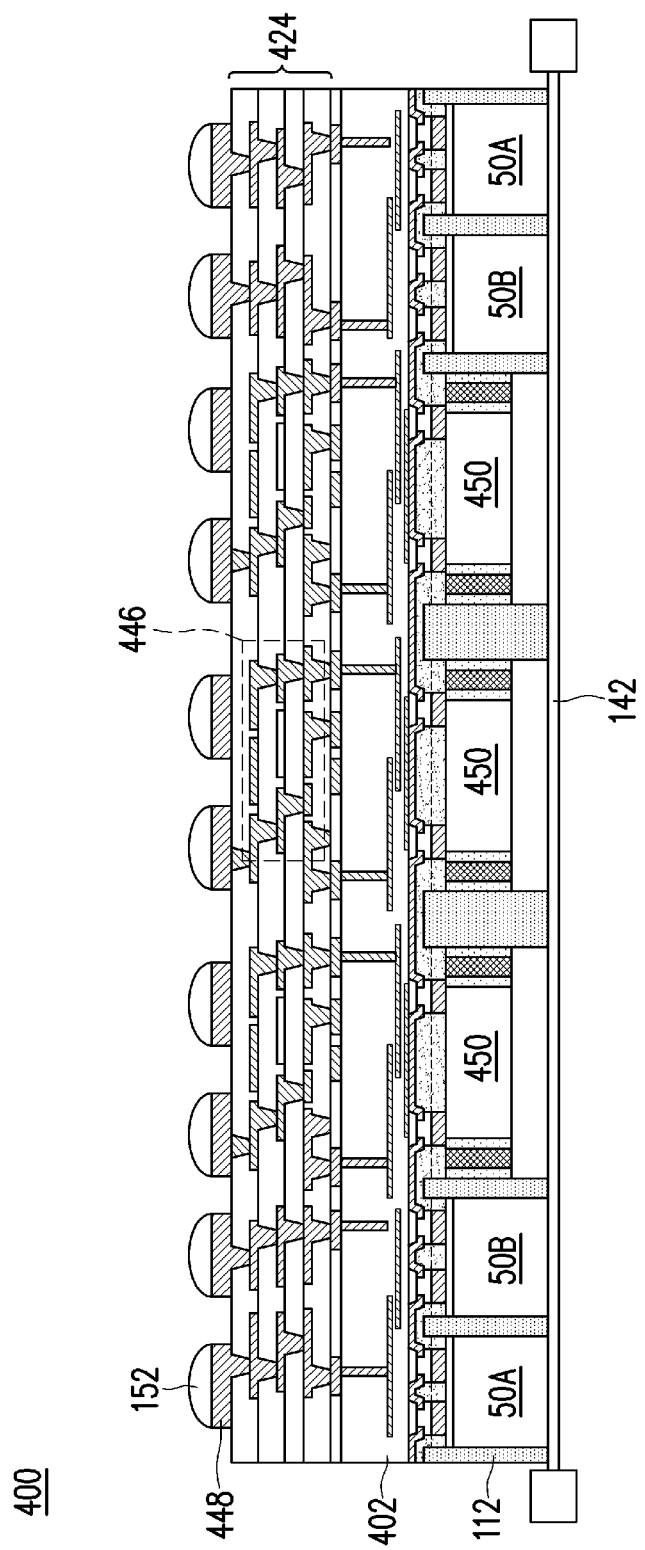

In FIG. 32, the structure is turned over again and conductive connectors 152 are formed on the UBMs 148. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 33:
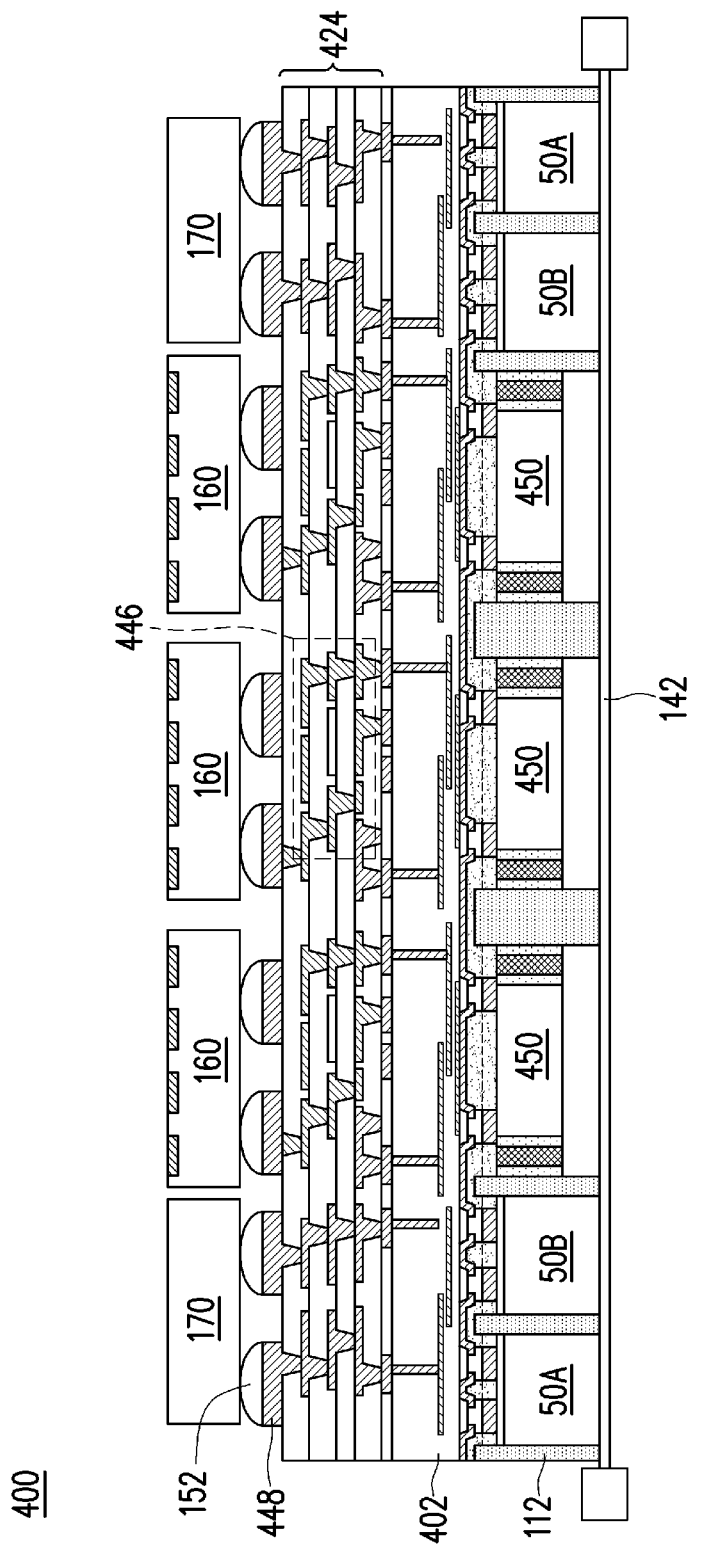

In FIG. 33, components 160 and external connectors 170 are attached to the redistribution structure 424. The components 160 may be dies, chips, or packages such as integrated fan-out (InFO) packages. In some embodiments, the components 160 comprise Pulse Width Modulation (PWM) circuits that comprise Metal Oxide Semiconductor Field Effect Transistors (MOSFETs) for power management. The external connectors 170 are electrical and physical interfaces for the system-on-wafer 100 to external systems. For example, when the system-on-wafer 100 is installed as part of a larger external system, such as a data center, the external connectors 170 may be used to couple the system-on-wafer 170 to the external system. Examples of external connectors 170 include optical connectors (see below, FIG. 38), receptors for ribbon cables, flexible printed circuits, or the like.

Figure 34:
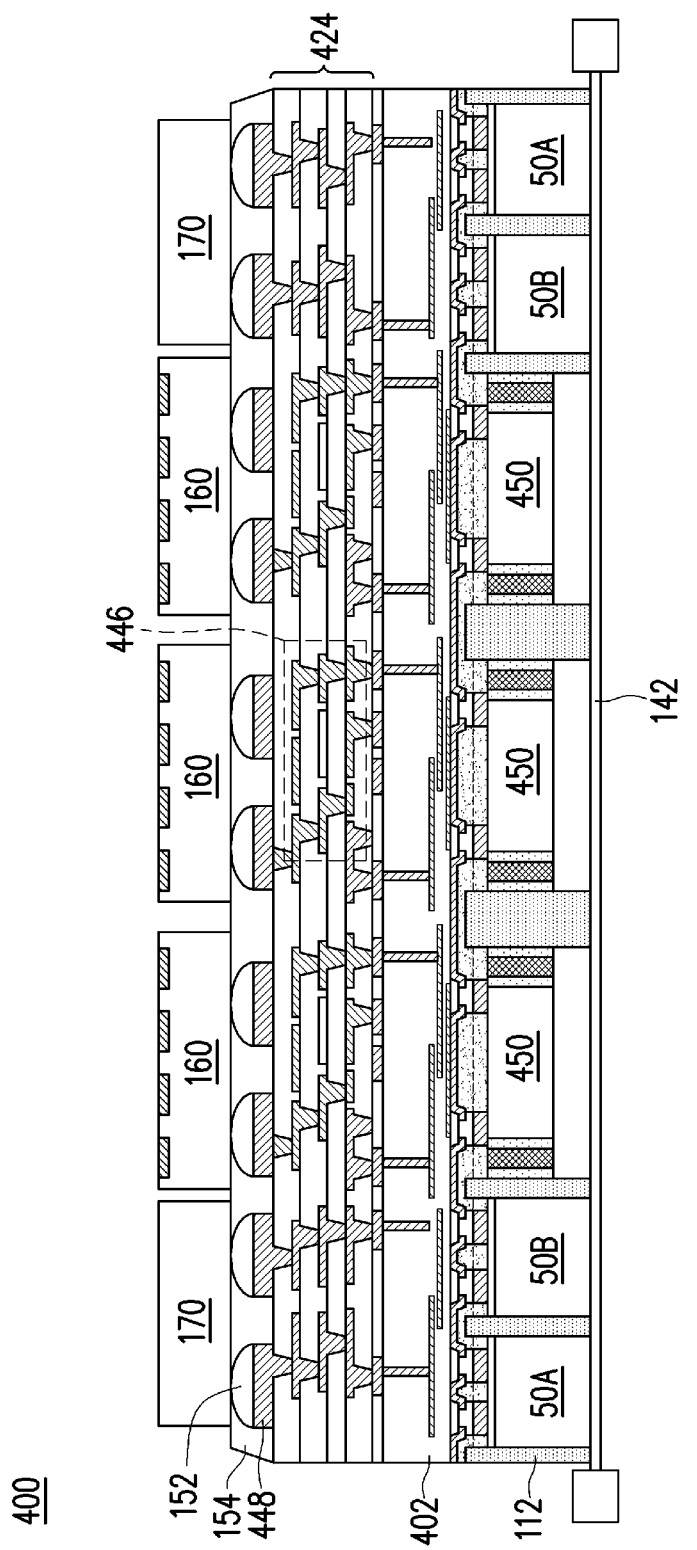

In FIG. 34, an underfill 154 may be formed to fill the gaps between the components 160 and external connectors 170 and the redistribution structure 122. The underfill 154 may be formed by a capillary flow process after the components 160 and external connectors 170 are attached, or may be formed by a suitable deposition method before the components 160 and external connectors 170 are attached.

Figure 35:
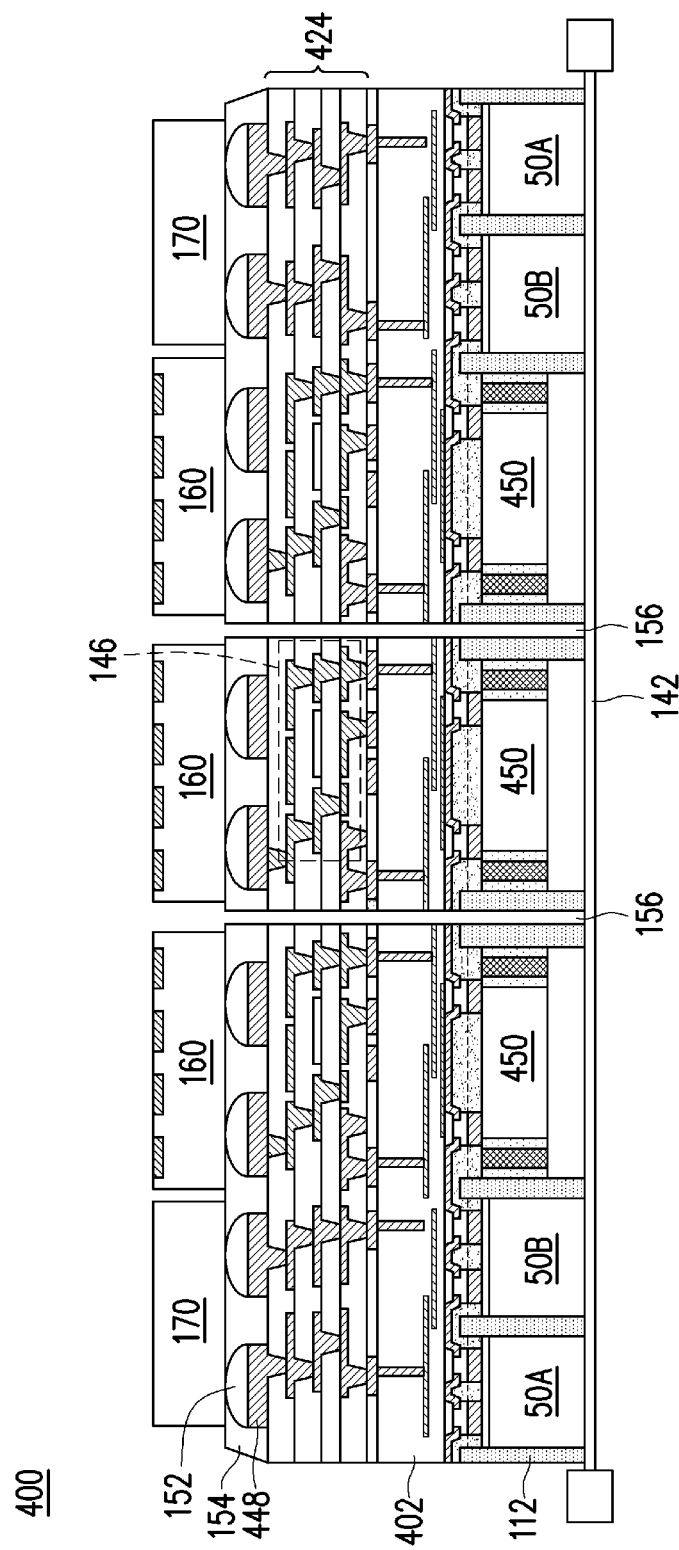

In FIG. 35, bolt holes 156 are formed through the system-on-wafer 400. The bolt holes 156 may be formed by a drilling process such as laser drilling, mechanical drilling, or the like. The bolt holes 156 may be formed by drilling an outline for the bolt holes 156 with the drilling process, and then removing the material separated by the outline. In some embodiments, the bolt holes 156 are formed earlier, such as prior to forming the conductive connectors in FIG. 32. However, the bolt holes 156 may be formed at any suitable step of the process.

Figure 36:
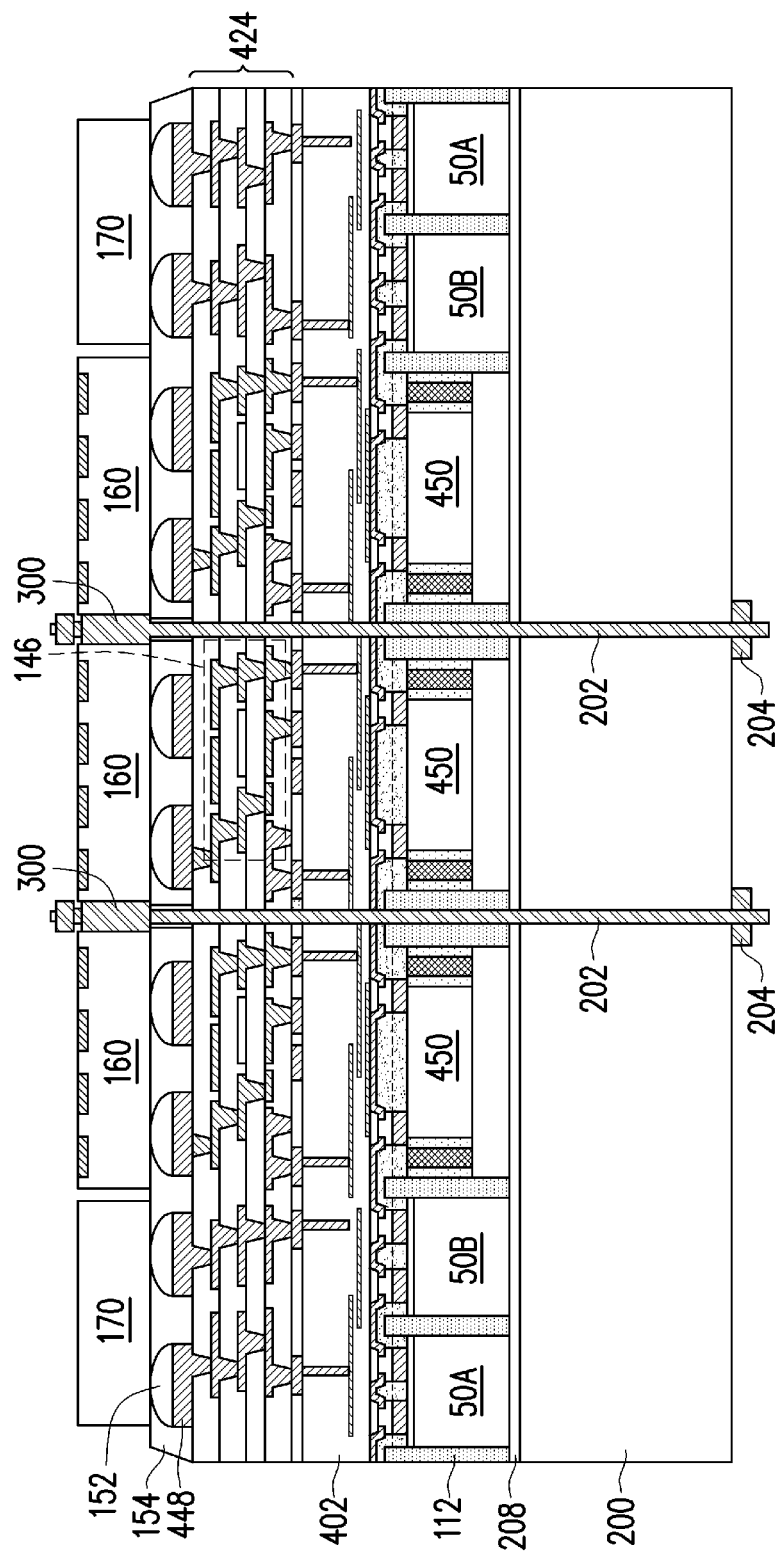
FIG. 36 illustrates a cross-sectional view of another system-on-wafer assembly, in assembly, in accordance with some embodiments.

FIG. 36 illustrates a cross-sectional view of a system-on-wafer assembly, in accordance with some embodiments. The system-on-wafer assembly is formed by securing the system-on-wafer 400 between a thermal module 200 and a mechanical brace 300. The thermal module 200 may be a heat sink, a heat spreader, a cold plate, or the like. The mechanical brace 30o is a rigid support that may be formed from a material with a high stiffness, such as a metal, e.g., steel, titanium, cobalt, or the like. The mechanical brace 30o physically engages portions of the redistribution structure 424. Warpage of the system-on-wafer 400, such as that induced by carrier substrate debonding, may be reduced by clamping the system-on-wafer 400 between the thermal module 200 and mechanical brace 300. The mechanical brace 30o may be a grid that has openings exposing components 160 and external connectors 170, for ease of module installation.

The system-on-wafer 400 is removed from the tape 142 and is fastened between the thermal module 200 and mechanical brace 30o with bolts 202. The bolts 202 are threaded through the bolt holes 156 of the system-on-wafer 100, through corresponding bolt holes in the thermal module 200, and through corresponding bolt holes in the mechanical brace 300. Fasteners 204 are threaded onto the bolts 202 and tightened to clamp the system-on-wafer 100 between the thermal module 200 and mechanical brace 300. The fasteners 204 may be, e.g., nuts that thread to the bolts 202. The fasteners 204 attach to the bolts 202 at both sides of the system-on-wafer assembly (e.g., at the side having the thermal module 200 (sometimes referred to as the back side) and at the side having the mechanical brace 300 (sometimes referred to as the front side)). After being attached, portions of the mechanical brace 300 are disposed between the components 160 and/or the external connectors 170.

Before fastening together the various components, a thermal interface material (TIM) 208 may be dispensed on the back side of the system-on-wafer 400, physically and thermally coupling the thermal module 200 to the integrated circuit dies 50. In some embodiments, the TIM 206 is formed of a film comprising indium and a HM03 type material. During fastening, the fasteners 204 are tightened, thereby increasing the mechanical force applied to the system-on-wafer 400 by the thermal module 200 and the mechanical brace 300. The fasteners 204 are tightened until the thermal module 200 exerts a desired amount of pressure on the TIM 206.

Figure 37:
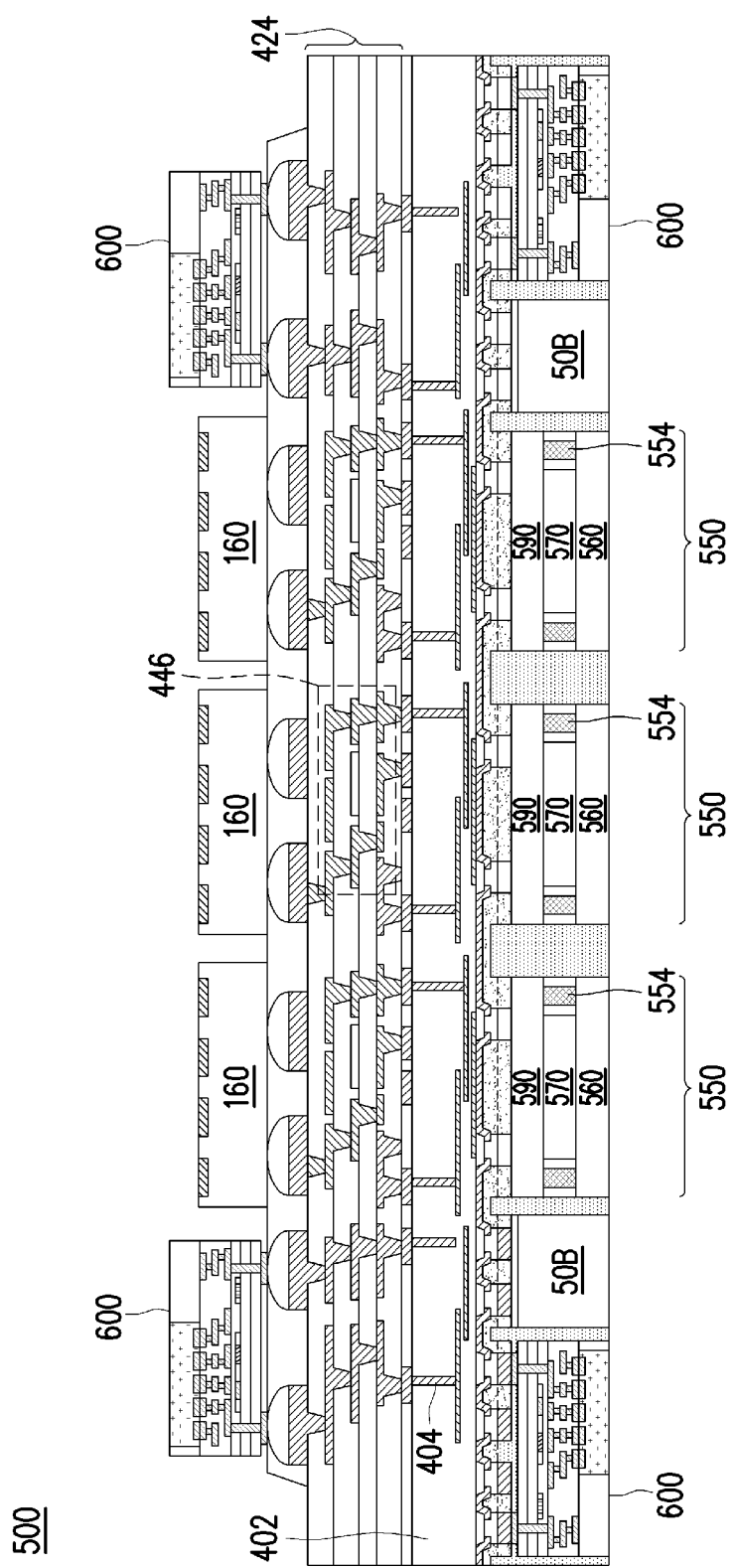
FIG. 37 illustrates a cross-sectional view of another system-on-wafer, in accordance with some embodiments.

FIG. 37 illustrates a system-on-wafer 500, in accordance with some embodiments. The system-on-wafer 450 may be similar to the system-on-wafer 400 described above in reference to FIG. 33, where like reference numerals indicate like elements formed using like processes, but with optical connectors 600, as described below with respect to FIG. 39, attached to the bottom side of the interposer 402 in place of the IC dies 50A and encapsulated by the encapsulant 112, as well as being attached to the top of the redistribution structure 424. In some embodiments, the functions of the IC dies 50A and packages 450 are combined in packages 550, as described below in respect to FIG. 38, that are hybrid bonded to the interposer 402. Placing I/O circuitry with SRAM circuitry together in the packages 550 may provide minimal distance between the SRAM and I/O circuitry, which may lead to improved system efficiency. Having optical connections 600 attached on both sides of the system-on-wafer 500 may allow for high bandwidth connections to external devices.

Figure 38:
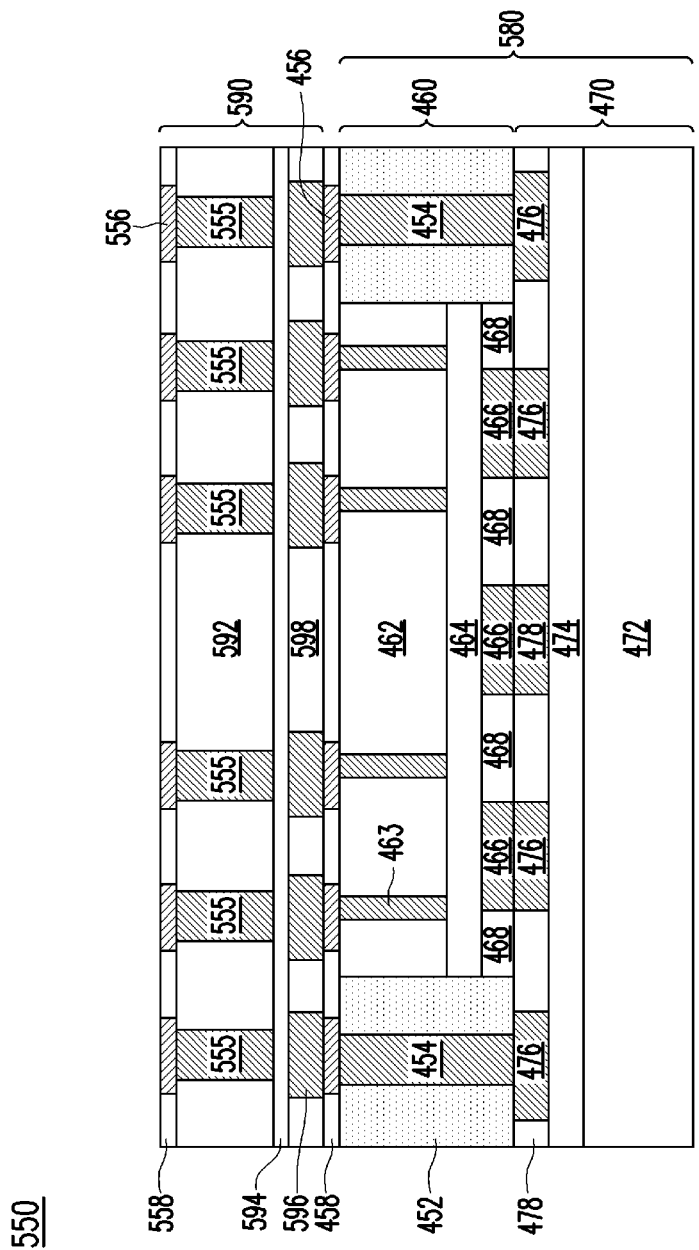
FIG. 38 illustrates a cross-sectional view of another package, in accordance with some embodiments.

FIG. 38 illustrates a cross-sectional view of a package 550 that may be part of a system-on-wafer 500 as illustrated above by FIG. 37, in accordance with some embodiments. The package 550 comprises an IC die 590 stacked on a package 580, and the package 580 comprises IC dies 460 and 470. In some embodiments, the package 580 is similar to the package 450 described above in reference to FIG. 22, where like reference numerals indicate like elements formed using like processes. The IC die 460 may be a memory die (e.g., dynamic random access memory (DRAM) die, static random access memory (SRAM) die, etc.), a power management die (e.g., power management integrated circuit (PMIC) die), the IC die 470 may be a logic die e.g., central processing unit (CPU), graphics processing unit (GPU), system-on-a-chip (SoC), application processor (AP), microcontroller, etc.), and the IC die 590 may be an input/output (I/O) die. In some embodiments, the IC die 460 is an SRAM die, the IC die 470 is a SoC die, and the IC die 590 is an I/O die.

In some embodiments, the IC die 590 has similar structures and materials as the IC die 50 described above with respect to FIG. 2. The IC die 590 has a semiconductor substrate 592, an interconnect structure 594 over the semiconductor substrate 592, die connectors 596 physically and electrically coupled to the interconnect structure 594, and a dielectric layer 598 over the interconnect structure 594 and laterally encapsulating the die connectors 596. The IC die 590 may also have through substrate vias (TSVs) 555 extending through the semiconductor substrate 592 and physically and electrically coupling the interconnect structure 594.

The package 580 and the IC die 590 may be bonded by a suitable bonding method between the bonding layer 458 and the dielectric layer 468 and between the conductive pads 456 and the die connectors 596, such as hybrid bonding. The hybrid bonding may be performed in a similar manner as the hybrid bonding between the IC dies 50 and the interposer 102 as described above with respect to FIG. 4.

Conductive pads 556 are then formed over top surfaces of the TSVs 555 and a bonding layer 558 is formed over the semiconductor substrate 592 between the conductive pads 456. The conductive pads 556 and the bonding layer 558 may be formed using substantially similar methods and materials as the conductive pads 108 and the bonding layer no as described above in reference to FIG. 3. However, any suitable method or materials may be used. The conductive pads 556 and the bonding layer 558 may allow package 550, comprising the IC dies 460, 470, and 590, to be hybrid bonded to, e.g. an interposer 402 as described above with respect to FIG. 37.

Figure 39:
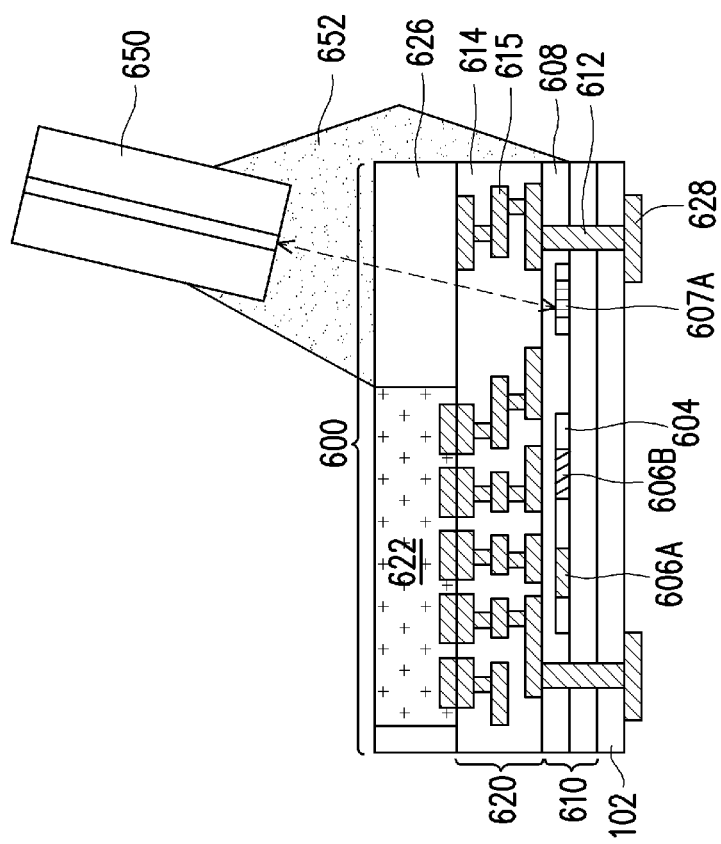
FIG. 39 illustrates a cross-sectional view of an optical connector, in accordance with some embodiments.

FIG. 39 illustrates a detailed view of an example of an optical connector 600, in accordance with some embodiments. Optical connectors such as an optical connector 600 may be integrated into any of the system-on-wafers shown above, such as in the system-on-wafer 500 (see above, FIG. 37), or in the system-on-wafer 100 (see above, FIG. 1) or the system-on-wafer 400 (see above, FIG. 21) in place of an external connector 170. The optical connector 600 comprises a grating coupler 607A configured to optically couple to an optical fiber 650. The optical fiber 650 may be mounted to the optical connector 600 using an optical glue 652 or the like. The optical fiber 650 may be mounted at an angle with respect to the vertical axis or may be laterally offset from the grating coupler 607A. A grating coupler 607A may be located in a photonic routing structure 610 near the edges of optical connector 600 or away from the edges of the optical connector 600. The optical signals and/or optical power transmitted between the vertically mounted optical fiber 650 and the grating coupler 607A are transmitted through the dielectric layer 608, the dielectric layers 615 in the interconnect structure 620, and the dielectric material 626 formed over the grating coupler 607A. For example, optical signals may be transmitted from the optical fiber 650 to the grating coupler 607A and into the waveguides 604, wherein the optical signals may be detected by a photodetector 606A and transmitted as electrical signals through conductive features 614 into an electronic die 622. Optical signals generated within the waveguides 604 by the modulator 606B may similarly be transmitted from the grating coupler 607A to the vertically mounted optical fiber 650. Conductive pads 628 may be physically and electrically coupled to respective conductive pads 508 or conductive connectors 152 in the system-on-wafer 500 (see above, FIG. 37). Vias 612 extending through the photonic routing structure 610 and through the substrate 602 physically and electrically couple the conductive pads 628 with the conductive features 614 in order to electrically connect the electronic die 622 with the system-on-wafer 500.

Embodiments may achieve advantages. System-on-wafer (SoW) assemblies may have small form factors, allowing for compact structure to exhibit superior electrical performance. Integrated passive devices (IPDs), e.g. capacitors, or static random access memory (SRAM) circuitry may be embedded into wafer scale interposer(s). Heterogeneous integration with short interconnects from system-on-chip (SoC) dies to SRAM circuitry may be included in the SoW structure. Symmetrical molding structure may reduce small component warpage. Embedded solenoid inductors may allow for redistribution structures miniaturization of voltage regulator modules (VRMs). The super-large micro system may have high performance computing power compared with a conventional printed circuit board (PCB) system due to wafer scale patterning of the wafer scale interposer and the redistribution structure. The wafer scale patterning may be performed with multi-mask exposure in a single layer or image shift exposure. High bandwidth between die-to-die interconnects may be provided by fine redistribution layer pitches of the interposer and InFO packages.

In accordance with an embodiment, a semiconductor device includes: a first plurality of dies encapsulated by an encapsulant; an interposer over the first plurality of dies, the interposer including a plurality of embedded passive components, each die of the first plurality of dies being electrically connected to the interposer; an interconnect structure over and electrically connected to the interposer, the interconnect structure including a solenoid inductor in a metallization layer of the interconnect structure; and a plurality of conductive pads on a surface of the interconnect structure opposite the interposer. In an embodiment, the semiconductor device further includes a first package encapsulated by the encapsulant, the first package being electrically connected to the interposer, the first package including static random access memory (SRAM) circuitry. In an embodiment, the SRAM circuitry is in a first die of the first package and a second die of the first package includes a system-on-chip. In an embodiment, a third die of the first package includes an input/output device. In an embodiment, a first component is attached to conductive pads of the plurality of conductive pads, the first component including a pulse width modulation (PWM) controller. In an embodiment, the first component is electrically coupled to the solenoid inductor, the solenoid inductor being a voltage regulator module for the first component. In an embodiment, a first connector is attached to conductive pads of the plurality of conductive pads. In an embodiment, the first connector is a first optical connector. In an embodiment, a second optical connector is electrically coupled to a respective embedded passive component of the plurality of embedded passive components of the interposer, the second optical connector being on an opposite side of the interposer from the first optical connector. In an embodiment, the second optical connector is encapsulated by the encapsulant.

In accordance with another embodiment, a semiconductor device includes: a first molding compound around a first die and a second die; an interposer over the first die, the second die, and the first molding compound, the interposer including static random access memory (SRAM) circuitry, the first die and the second die each being electrically coupled to the interposer; a conductive via on the interposer; a third die bonded to and electrically coupled to the interposer; a second molding compound around the conductive via and the third die; an interconnect structure over the conductive via, the third die, and the second molding compound, the interconnect structure including a solenoid inductor; and a plurality of contact pads on the interconnect structure opposite the conductive via, the third die, and the second molding compound. In an embodiment, the interposer is a wafer, the wafer including silicon. In an embodiment, the third die is an integrated passive device. In an embodiment, the first die is electrically coupled to the interposer with a metal-metal bond.

In accordance with yet another embodiment, a method of forming a semiconductor device includes: bonding a first plurality of dies to an interposer, the interposer including a plurality of conductive features, each die of the respective plurality of dies being bonded to a respective conductive feature of the plurality of conductive features; encapsulating the first plurality of dies with an encapsulant; forming a first interconnect over a first surface of the interposer, the first surface being opposite the first plurality of dies, forming the first interconnect including: forming a bottom portion of the first interconnect; placing a magnetic core on the bottom portion of the first interconnect; and forming a top portion of the first interconnect over the bottom portion of the first interconnect and the magnetic core, wherein forming the top portion forms a solenoid inductor including the magnetic core; forming a first plurality of contact pads on the first interconnect opposite the interposer; and attaching a first device to the first interconnect, the first device being electrically coupled to contact pads of the first plurality of contact pads. In an embodiment, bonding the first plurality of dies to the interposer includes forming a metal-metal bond and forming an oxide-oxide bond. In an embodiment, a die of the first plurality of dies includes static random access memory (SRAM) circuitry. In an embodiment, the interposer includes a plurality of embedded passive components. In an embodiment, the interposer includes static random access memory (SRAM) circuitry. In an embodiment, the method further includes: forming a conductive via on the interposer; bonding an integrated passive device (IPD) die to the interposer; and encapsulating the conductive via and the IPD die with a second encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first plurality of dies encapsulated by an encapsulant;
   an interposer over the first plurality of dies, the interposer comprising a plurality of embedded passive components, each die of the first plurality of dies being electrically connected to the interposer;
   an interconnect structure over and electrically connected to the interposer, the interconnect structure comprising a solenoid inductor in a metallization layer of the interconnect structure;
   a plurality of conductive pads on a surface of the interconnect structure opposite the interposer; and
   a first component attached to conductive pads of the plurality of conductive pads, wherein the first component is electrically coupled to the solenoid inductor, and wherein the solenoid inductor is a voltage regulator module for the first component.

2. The semiconductor device of claim 1 further comprising a first package encapsulated by the encapsulant, the first package being electrically connected to the interposer, the first package comprising static random access memory (SRAM) circuitry.

3. The semiconductor device of claim 2, wherein the SRAM circuitry is in a first die of the first package and a second die of the first package comprises a system-on-chip.

4. The semiconductor device of claim 3, wherein a third die of the first package comprises an input/output device.

5. The semiconductor device of claim 1, wherein the first component comprises a pulse width modulation (PWM) controller.

6. The semiconductor device of claim 1, wherein a first connector is attached to conductive pads of the plurality of conductive pads.

7. The semiconductor device of claim 6, wherein the first connector is a first optical connector.

8. The semiconductor device of claim 7, wherein a second optical connector is electrically coupled to a respective embedded passive component of the plurality of embedded passive components of the interposer, the second optical connector being on an opposite side of the interposer from the first optical connector.

9. The semiconductor device of claim 8, wherein the second optical connector is encapsulated by the encapsulant.

10. The semiconductor device of claim 1, wherein the interposer is a wafer comprising silicon.

11. A semiconductor device, comprising:
a first molding compound around a first die and a second die;
an interposer over the first die, the second die, and the first molding compound, the interposer comprising static random access memory (SRAM) circuitry, the first die and the second die each being electrically coupled to the interposer;
a conductive via on the interposer;
a third die bonded to and electrically coupled to the interposer;
a second molding compound around the conductive via and the third die;
an interconnect structure over the conductive via, the third die, and the second molding compound, the interconnect structure comprising a solenoid inductor; and
a plurality of contact pads on the interconnect structure opposite the conductive via, the third die, and the second molding compound.

12. The semiconductor device of claim 11, wherein the interposer is a wafer, the wafer comprising silicon.

13. The semiconductor device of claim 11, wherein the third die is an integrated passive device.

14. The semiconductor device of claim 11, wherein the first die is electrically coupled to the interposer with a metal-metal bond.

15. A semiconductor device, comprising:
an interposer, wherein the interposer is a wafer comprising silicon, and wherein the interposer comprises a plurality of conductive pads on a first side of the interposer;
a first die and a second die bonded to the plurality of conductive pads, wherein the first die and the second die are electrically coupled to the interposer;
a first molding compound on the first side of the interposer and around the first die and the second die;
an interconnect structure on a second side of the interposer, wherein the interconnect structure comprises a solenoid inductor with a magnetic core;
a bolt through the interposer and the interconnect structure;
a plurality of contact pads on the interconnect structure opposite the interposer; and
a first device bonded to the interconnect structure, wherein the first device is electrically coupled to the plurality of contact pads.

16. The semiconductor device of claim 15, wherein the first die and the second die are bonded to the interposer by metal-metal bonds and oxide-oxide bonds.

17. The semiconductor device of claim 15, wherein the interposer comprises a plurality of embedded passive components.

18. The semiconductor device of claim 15, wherein the interposer comprises static random access memory (SRAM) circuitry.

19. The semiconductor device of claim 15, further comprising a conductive via and a third die between the interposer and the interconnect structure, wherein the conductive via and the third die are electrically coupled to the interposer and the interconnect structure.

20. The semiconductor device of claim 19, wherein the third die is an integrated passive device.

* * * * *